US012660375B2

(12) United States Patent
Zhang et al.

(10) Patent No.: US 12,660,375 B2
(45) Date of Patent: Jun. 16, 2026

(54) LIGHT-EMITTING DIODE AND LIGHT-EMITTING DEVICE HAVING THE SAME

(71) Applicant: Quanzhou San'an Semiconductor Technology Co., Ltd., Nanan City (CN)

(72) Inventors: Liming Zhang, Xiamen (CN); Renlong Yang, Xiamen (CN); Heying Tang, Xiamen (CN); Quanyang Ma, Xiamen (CN); Xingrong Chen, Nanan City (CN); Chung-Ying Chang, Xiamen (CN)

(73) Assignee: QUANZHOU SAN'AN SEMICONDUCTOR TECHNOLOGY CO., LTD., Nanan City (CN)

( * ) Notice: Subject to any disclaimer, the term of this patent is extended or adjusted under 35 U.S.C. 154(b) by 375 days.

(21) Appl. No.: 18/475,649

(22) Filed: Sep. 27, 2023

(65) Prior Publication Data

US 2024/0113258 A1      Apr. 4, 2024

(30) Foreign Application Priority Data

Sep. 30, 2022   (CN) .......................... 202211208152.1
Sep. 30, 2022   (CN) .......................... 202211209957.8

(51) Int. Cl.
*H10H 20/819*        (2025.01)
*H10H 20/831*        (2025.01)
(52) U.S. Cl.
CPC ........ *H10H 20/819* (2025.01); *H10H 20/831* (2025.01)
(58) Field of Classification Search
None
See application file for complete search history.

(56) References Cited

U.S. PATENT DOCUMENTS

| 2005/0104080 | A1 | 5/2005 | Ichihara et al. |
| 2020/0176635 | A1* | 6/2020 | Wei ......................... H10H 20/01 |
| 2020/0373472 | A1* | 11/2020 | Yang ................. H10H 20/8312 |

FOREIGN PATENT DOCUMENTS

| CN | 108346726 A | 7/2018 |
| CN | 113889558 A | 1/2022 |

(Continued)

OTHER PUBLICATIONS

Search Report appended to an Office Action, which was issued to Chinese counterpart application No. 202211208152.1 by the CNIPA on Nov. 8, 2022 with an English translation thereof.

(Continued)

*Primary Examiner* — Nishath Yasmeen
(74) *Attorney, Agent, or Firm* — MUNCY, GEISSLER, OLDS & LOWE, P.C.

(57) ABSTRACT

A light-emitting diode (LED) includes a semiconductor structure, a transparent conducting layer, a first electrode, and a second electrode. The semiconductor structure has a lower surface and an upper surface, and includes a first semiconductor layer, an active layer, and a second semiconductor layer that are sequentially stacked in a laminating direction from the lower surface to the upper surface. The transparent conducting layer is located on the second semiconductor layer. The first electrode is located on the first semiconductor layer. The second electrode is located on the transparent conducting layer. When viewing the semiconductor structure and the transparent conducting layer from above the LED. The semiconductor structure has a shortest side with a length of X μm. The transparent conducting layer has at least one bevel corner portion that has a radius of curvature R1 ranging from 15 to X/2 μm.

20 Claims, 20 Drawing Sheets

(56) References Cited

FOREIGN PATENT DOCUMENTS

| | | |
|---|---|---|
| CN | 114256398 A | 3/2022 |
| CN | 216213514 U | 4/2022 |
| JP | 5893699 B1 | 3/2016 |

OTHER PUBLICATIONS

Search Report appended to an Office Action, which was issued to Chinese counterpart application No. 202211209957.8 by the CNIPA on Nov. 11, 2022 with an English translation thereof.

* cited by examiner

LIGHT-EMITTING DIODE AND LIGHT-EMITTING DEVICE HAVING THE SAME

CROSS-REFERENCE TO RELATED APPLICATION

This application claims priority to Chinese Invention Patent Application No. 202211209957.8, filed on Sep. 30, 2022, and Chinese Invention Patent Application No. 202211208152.1, filed on Sep. 30, 2022. The Chinese Invention Patent applications are incorporated herein by reference in their entireties.

FIELD

The disclosure relates to a light-emitting diode (LED) and a light-emitting device using the LED

BACKGROUND

Light-emitting diodes (LEDs) are light-emitting devices that are conventionally made from semiconductor materials such as GaN, GaAs, GaP, GaAsP. The LED has a light-emitting p-n junction at its core. LEDs have advantages such as high luminance, high efficiency, small size, and long service life, and currently are considered to be the lighting technology with the most future potential. LEDs have already been widely applied to lighting, traffic and monitoring, display technology, cinema, business communication and exchange, virtual meetings, and virtual reality.

Conventionally, LEDs use indium tin oxide (ITO) as a transparent conductive layer, the ITO helps to horizontally spread the current in the LED. Therefore, by increasing the size of the ITO transparent conducting, the horizontally current spreading efficiency in the LED may be improved, and the amount of photons emitted under the same time frame may be increased which means the Internal Quantum Efficiency (IQE) of the conventional LED is increased. Currently, in the field of LED design, the size of the ITO transparent conducting layer is maximized to increase the effective light-emitting area of an active layer of the conventional LED, and thereby increase effective light output. However, actual light output is decided by the External Quantum Efficiency (EQE) of the LED, and a high IQE does not increase actual light output of the LED if the photons in the active layer cannot be effectively extracted. Additionally, the ITO transparent conducting layer, despite being transparent, still has a negative impact on light output due to its light blocking effect. Therefore, when the size of the ITO transparent conducting layer is increased, if the decrease in light output due to light blocking exceeds the increase in light output due to improved horizontal current spreading, the EQE of the conventional LED will in fact decrease. Therefore, how to effectively design the LED and increase EQE is the question facing LED manufacturers.

SUMMARY

Therefore, an object of the disclosure is to provide a light-emitting diode (LED) and a light-emitting device that can alleviate at least one of the drawbacks of the prior art.

According to a first aspect of the disclosure, the light-emitting diode (LED) includes a semiconductor structure, a transparent conducting layer, a first electrode, and a second electrode. The semiconductor structure has a lower surface and an upper surface, and includes a first semiconductor layer, an active layer, and a second semiconductor layer that are sequentially stacked in a laminating direction from the lower surface to the upper surface. The transparent conducting layer is located on the second semiconductor layer. The first electrode is located on the first semiconductor layer. The second electrode is located on the transparent conducting layer. When viewing the semiconductor structure and the transparent conducting layer from above the LED. The semiconductor structure has a shortest side with a length of X μm. The transparent conducting layer has at least one bevel corner portion that has a radius of curvature R1 ranging from 15 to X/2 μm.

According to a second aspect of the disclosure, the light-emitting diode includes a semiconductor structure, a transparent conducting layer, a first electrode, and a second electrode. The semiconductor structure has a lower surface and an upper surface, and includes a first semiconductor layer, an active layer, and a second semiconductor layer that are sequentially stacked in a laminating direction from the lower surface to the upper surface. The transparent conducting layer is located on the second semiconductor layer. The first electrode is located on the first semiconductor layer. The second electrode is located on the transparent conducting layer. When viewing the semiconductor structure and the transparent conducting layer from above the LED, the semiconductor structure has at least one side and at least one vertex corner portion connected to the side. The transparent conducting layer has at least one side and at least one bevel corner portion connected to the side. The side and the at least one bevel corner portion of the transparent conducting layer respectively correspond to the side and the at least one vertex corner portion of the semiconductor structure. A minimum distance between the at least one bevel corner portion and the at least one vertex corner portion ranges from 2 to 150 μm.

According to a third aspect of the disclosure, the LED includes a semiconductor structure, a transparent conducting layer, a first electrode, and a second electrode. The semiconductor structure has a lower surface and an upper surface, and includes a first semiconductor layer, an active layer, and a second semiconductor layer that are sequentially stacked in a laminating direction from the lower surface to the upper surface. The transparent conducting layer is located on the second semiconductor layer. The first electrode is located on the first semiconductor layer. The second electrode is located on the transparent conducting layer. When viewing the semiconductor structure and the transparent conducting layer from above the LED, the semiconductor structure has two adjacent sides and one vertex corner portion that is connected between the two adjacent sides of the semiconductor structure. The transparent conducting layer has two adjacent sides and one bevel corner portion that is connected between the two sides of the transparent conducting layer. The two adjacent sides of the transparent conducting layer respectively correspond and are parallel to the two adjacent sides of the semiconductor structure. A radius of curvature of the bevel corner portion is greater than a radius of curvature of the vertex corner portion.

According to a fourth aspect of the disclosure, the light-emitting device includes the LED as described above.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
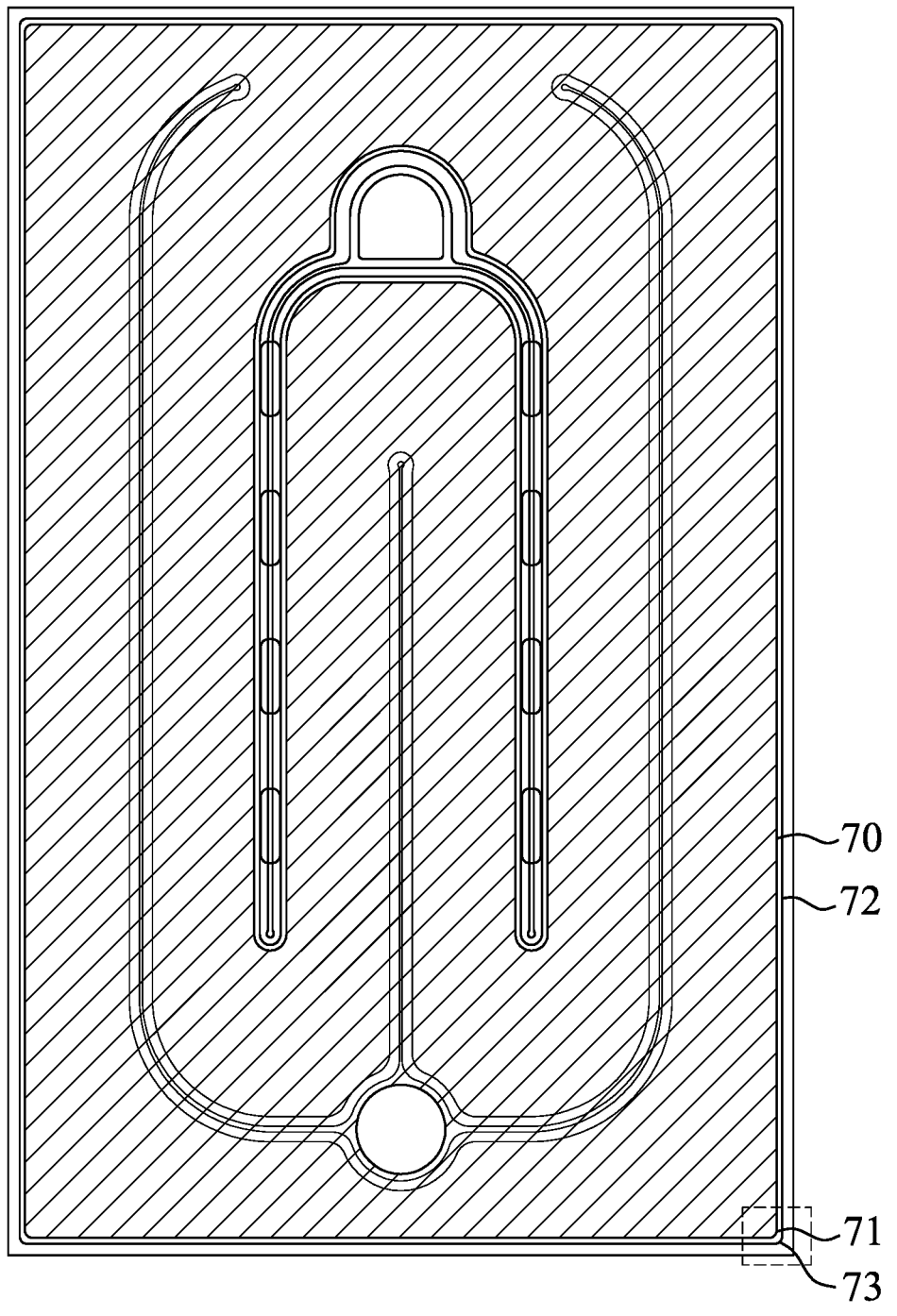
FIG. 1 is a schematic view illustrating a conventional light-emitting diode.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 3:
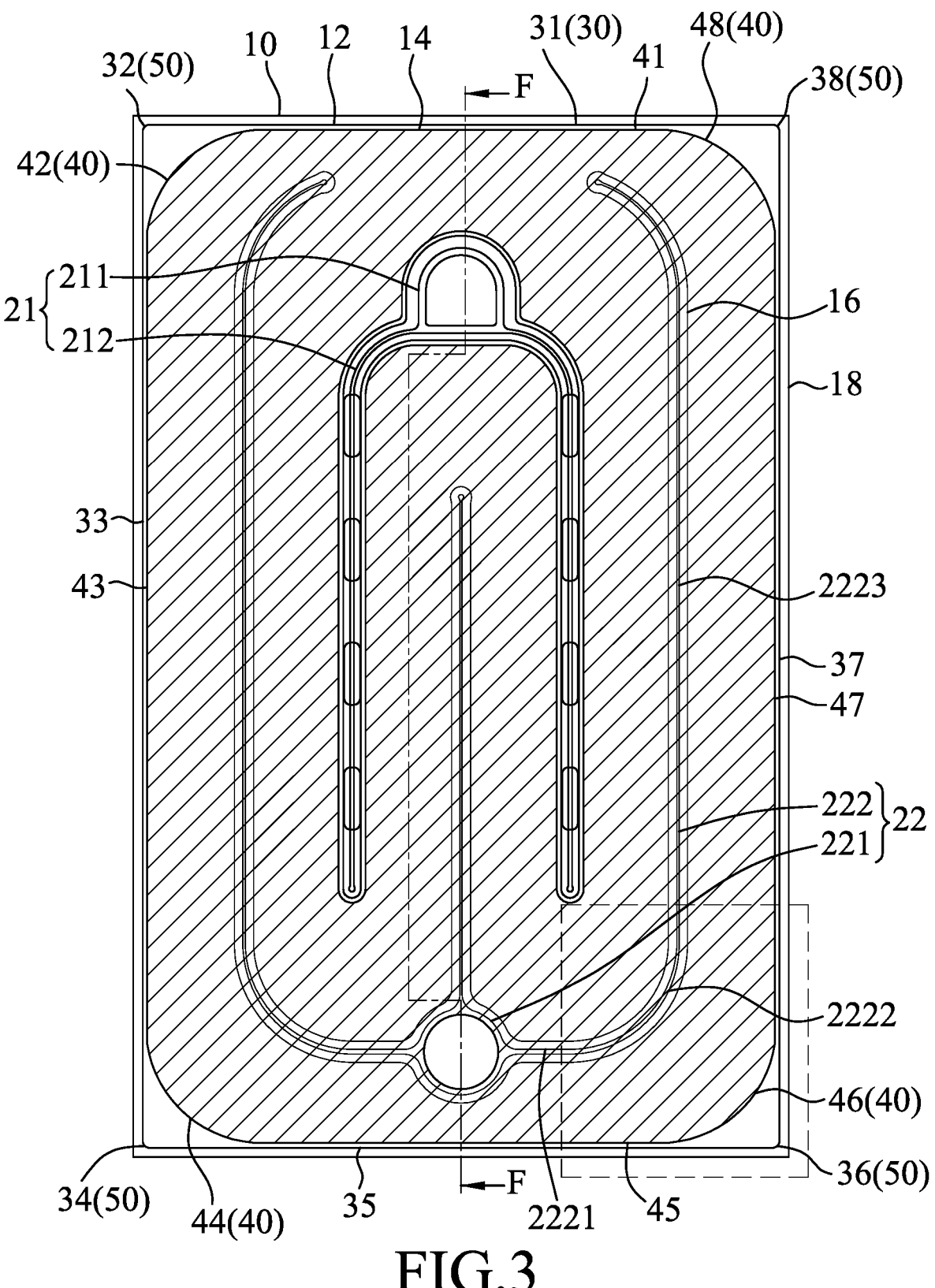
FIG. 3 is a schematic view illustrating an embodiment of a light-emitting diode (LED) according to the present disclosure.
Figure 4:
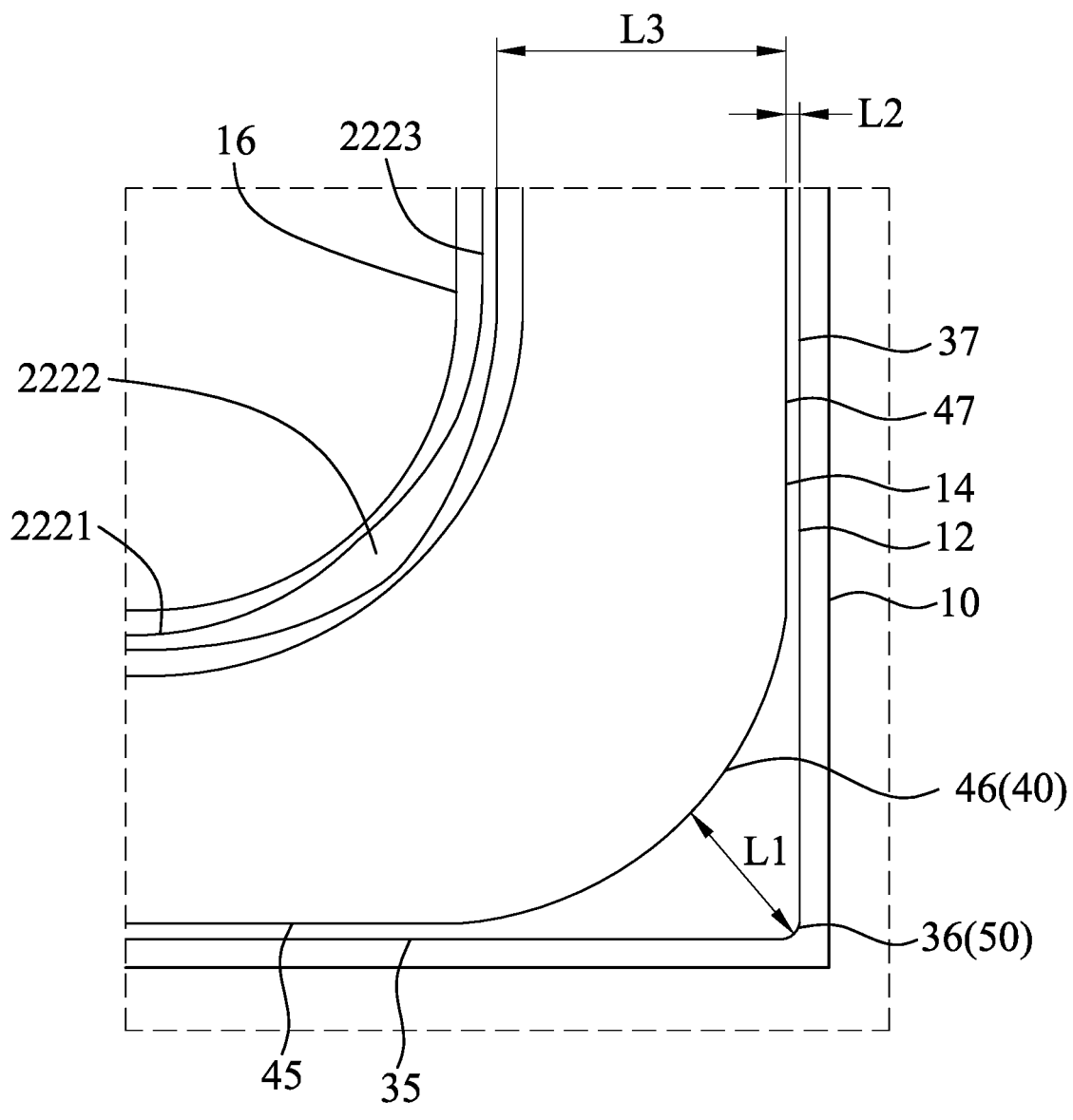
FIG. 4 is a fragmentary enlarged schematic view illustrating the embodiment in FIG. 3.
Figure 5:
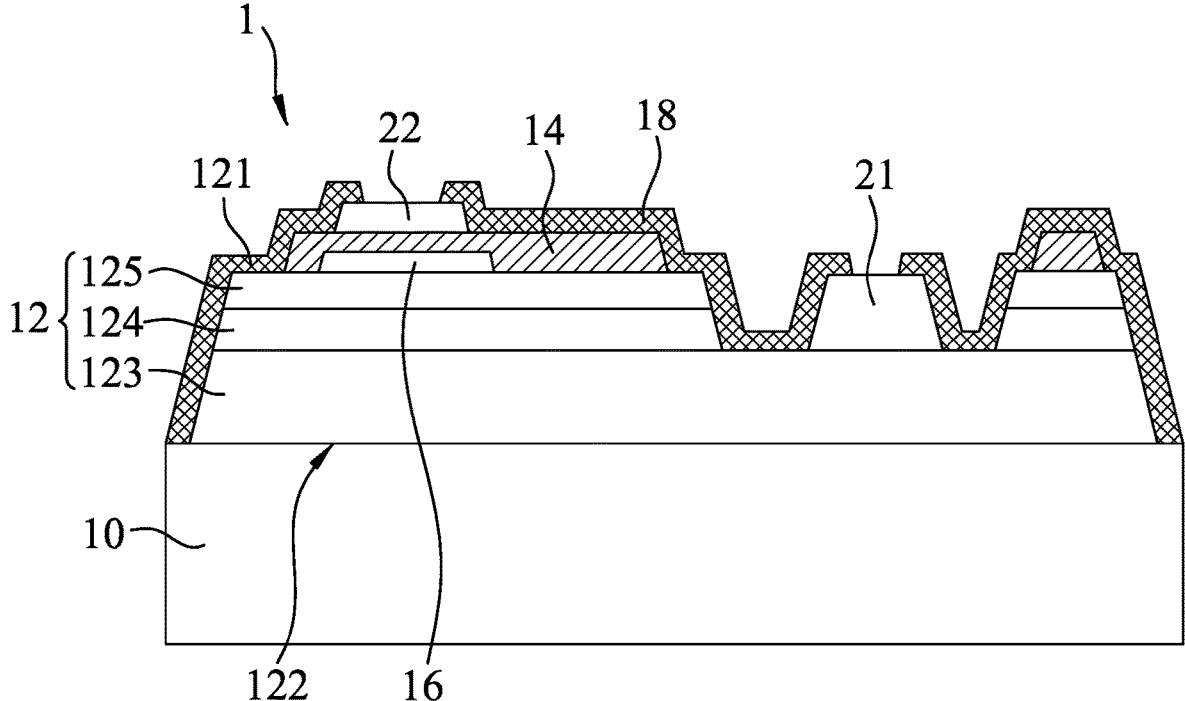
FIG. 5 is a schematic cross-sectional view illustrating the embodiment in FIG. 3.

Referring to FIGS. 3, 4 and 5, a first embodiment of a light-emitting diode (LED) 1 according to the present disclosure includes a semiconductor structure 12, a transparent conducting layer 14, a first electrode 21, and a second electrode 22. It should be noted that the transparent conducting layer 14 is filled in with slashed lines in the figures to more clearly demarcate the shape of the transparent conducting layer 14.

The semiconductor structure 12 is disposed on a substrate 10. In some embodiments, the substrate 10 may be an insulating substrate. In some embodiments, the substrate 10 may be made of a transparent or semi-transparent material. In this embodiment, the substrate 10 is a sapphire substrate. However, in other embodiments, the substrate 10 may be a patterned sapphire substrate. It should be noted that this is not a limitation of the disclosure. In some embodiments, the substrate 10 may be made of a conducting material or a semiconductor material. For example, the substrate 10 may include silicon carbide, silicon, magnesium-aluminum composite oxide, magnesium oxide, lithium aluminum oxide, aluminum gallium oxide, or gallium nitride.

The semiconductor structure 12 has a lower surface 122 and an upper surface 121 opposite to the lower surface 122, and includes a first semiconductor layer 123, an active layer 124, and a second semiconductor layer 125 that are sequentially stacked in a laminating direction from the lower surface 122 to the upper surface 121. In other words, the active layer 124 is located between the first semiconductor layer 123 and the second semiconductor layer 125. A portion of an upper surface of the first semiconductor layer 123 that is not covered by the active layer 124 and the second semiconductor layer 125 is formed into a mesa, and the first electrode 21 is disposed on the mesa. The first semiconductor layer 123 may be an n-type semiconductor layer which provides electrons to the active layer 124. In some embodiments, the first semiconductor layer 123 includes an n-type doped nitride layer. The n-type doped nitride layer may include one or multiple n-type dopants chosen from the group IV elements. The n-type dopant(s) may include one of Si, Ge, and Sn, or any combinations thereof. In some embodiments, a buffer layer may be provided between the first semiconductor layer 123 (n-type semiconductor layer) and the substrate 10 so as to reduce lattice mismatch between the substrate 10 and the first semiconductor layer 123. The buffer layer may include an unintentionally doped AlN layer or an unintentionally doped AlGaN layer. Furthermore, in some embodiments, the first semiconductor layer 123 may be connected to the substrate 10 via an adhesion layer.

The active layer 124 may have a quantum well structure (QW). In some embodiments, the active layer 124 may have a multiple quantum well (MQW) structure that has alternating well layers and barrier layers. For example, the active layer 124 may have a GaN/AlGaN, InAlGaN/InAlGaN, or InGaN/AlGaN multiple quantum well structure. The wavelength of light emitted by the active layer 124 may be changed by adjusting the composition and thickness of the well layers. In order to increase light-emitting efficiency, the thickness of the well layers, the amount of alternating well and barrier layers, or other characteristics of the active layer 124 may be adjusted.

The second semiconductor layer 125 may be a p-type semiconductor layer that provides electron holes to the active layer 124. In some embodiments, the second semiconductor layer 125 includes a p-type doped nitride layer. The p-type doped nitride layer may include one or multiple p-type dopants chosen from the group II elements. For example, the p-type dopant may include Mg, Zn, Be or any combinations thereof. The second semiconductor layer 125 may have a single-layered structure or a multi-layered structure. It should be noted that the composition and configuration of the semiconductor structure 12 of the disclosure is not limited to the examples disclosed thus far, and may vary according to actual requirements.

The transparent conducting layer 14 is located on the second semiconductor layer 125. The transparent conducting layer 14 helps current spreading by guiding current coming from the second electrode 22 to evenly flow into the second semiconductor layer 125. The transparent conducting layer 14 may include indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO) or zinc oxide (ZnO); however, the disclosure is not limited to the examples given above.

The first electrode 21 is located on the first semiconductor layer 123. The first electrode 21 may be made of a metal material that may have a single layer structure, a double-layered structure or a multi-layered structure. For example, the first electrode 21 may be double-layered structure or a multi-layered metallic structure such as Ti/Al, Ti/Al/Ti/Au, Ti/Al/Ni/Au, V/Al/Pt/Au, etc. In some embodiments, the first electrode 21 may be directly formed on the mesa formed by the upper surface of the first semiconductor layer 123 and have good ohmic contact with the first semiconductor layer 123.

The second electrode 22 is located on the transparent conducting layer 14. The second electrode 22 may be made from a metal material which may be similar to or the same as the material used in the first electrode 21. However, in some embodiment, the second electrode 22 may be made from a material that is different from the first electrode 21.

When viewing the semiconductor structure 12 and the transparent conducting layer 14 from above the LED 1, the semiconductor structure 12 has a shortest side 30, the transparent conducting layer 14 has at least one bevel corner portion 40, and the semiconductor structure 12 has at least one vertex corner portion 50. The shortest side 30 of the semiconductor structure 12 has a length of X μm. The bevel corner portion 40 has a radius of curvature (R1) ranging from 15 to X/2 μm. The radius of curvature (R1) of the bevel corner portion 40 is greater than a radius of curvature of the vertex corner portion 50. By expanding the radius of curvature (R1) of the bevel corner portion 40 of the transparent conducting layer 14, the advantage on current spreading provided by the transparent conducting layer 14 may be greater than the negative affect of light blocking caused by the transparent conducting layer 14, thereby still resulting in an increase in the light output and an overall increase in the External Quantum Efficiency (EQE) of the LED 1.

Figure 2:
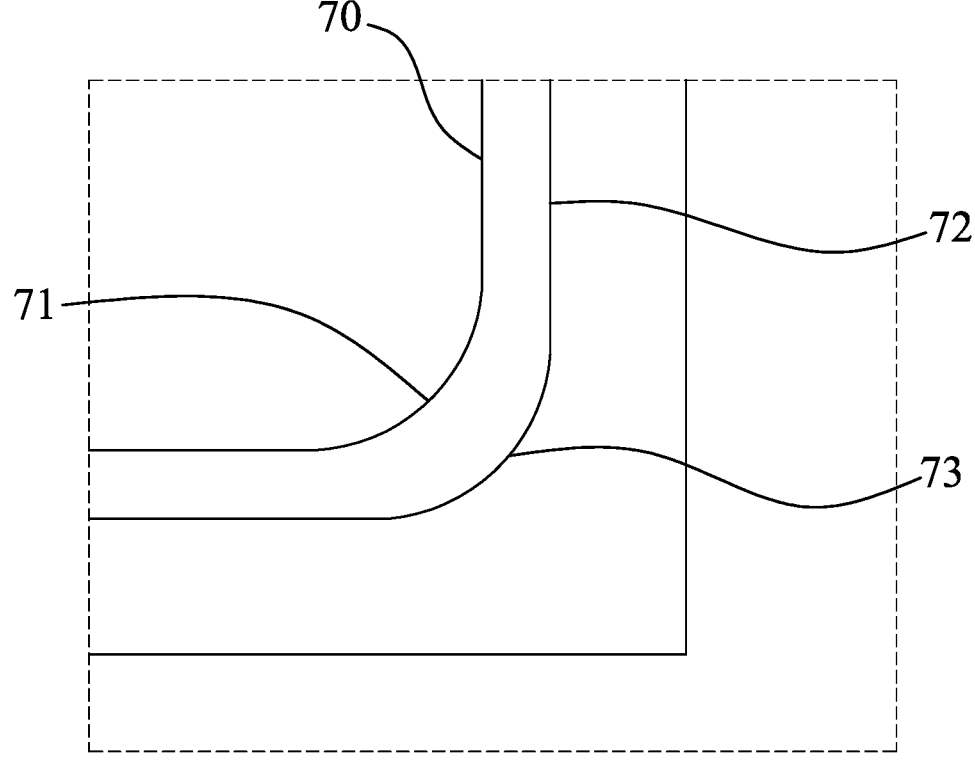
FIG. 2 is a fragmentary enlarged schematic view illustrating the conventional light-emitting diode in FIG. 1.

This is in contrast to a conventional LED as shown in FIGS. 1 and 2, where an indium tin oxide (ITO) layer 70 (analogous to the transparent conducting layer 14 of the present disclosure) is made as large as possible to promote current spreading and almost covers the entirety of a semiconductor structure 72 (analogous to the semiconductor structure 12 of the present disclosure) of the conventional LED. It may be observed from FIGS. 1 and 2 that a radius of curvature of a corner portion 71 of the ITO layer 70 is almost equal to or slightly smaller than a radius of curvature of a corner portion 73 of the semiconductor structure 72. In contrast to the conventional LED, the LED 1 of the present disclosure has the at least one bevel corner portion 40 which has a larger radius of curvature (R1) relative to the at least one vertex corner portion 50. The effect of this configuration is substantially analogous to removing a corner portion of the ITO layer 70 in the conventional LED and exposing more of the semiconductor structure 72. It should be noted that for the removed corner portion of the ITO layer 70, the decrease in light output due to light blocking caused by the removed corner portion is greater than the increase in light output due to the current spreading attributed by the removed corner portion. Thus, removing the corner portion of the ITO layer 70 will result in an increase to light output. Therefore, the transparent conducting layer 14 of the LED 1 of the disclosure having the bevel corner portion with a larger radius of curvature has increased light output and improved external quantum efficiency (EQE). More specifically, in some embodiments, the radius of curvature (R1) of the at least one bevel corner portion 40 ranges from 30 to 200 μm, and the radius of curvature of the at least one vertex corner portion 50 ranges from 5 to 15 μm. If the radius of curvature (R1) of the at least one bevel corner portion 40 of the transparent conducting layer 14 is too large, the increase in light output due to current spreading may be less than the decrease in light output due to light blocking; therefore, the radius of curvature (R1) should be appropriately specified. More specifically, when the radius of curvature (R1) of the at least one bevel corner portion 40 is between 30 and 200 μm, the improvement to EQE is most pronounced. Additionally, when the radius of curvature of the vertex corner portion 50 of the semiconductor structure 12 is increased, the area of the second semiconductor layer 125 is decreased, and light emission from side walls of the second semiconductor layer 125 will also decrease which results in a decrease in light output. Therefore, when the radius of curvature of the at least one vertex corner portion 50 ranges from 5 to 15 millimeters, the EQE of the LED 1 is optimal.

Referring to FIGS. 3 and 4, in this embodiment, when viewing the semiconductor structure 12 from above the LED 1, the semiconductor structure 12 has four sides and four vertex corner portions 50 which cooperatively define a periphery of the semiconductor structure 12. The four sides include a first short side 31, a first long side 33, a second short side 35, and a second long side 37 (listed in counter-clockwise order). The four vertex corner portions 50 include a first corner portion 32 disposed between the first short side 31 and the first long side 33, a second corner portion 34 disposed between the first long side 33 and the second short side 35, a third corner portion 36 disposed between the second short side 35 and the second long side 37, and a fourth corner portion 38 disposed between the second long side 37 and the first short side 31. The four corner portions and the four sides of the semiconductor structure 12 cooperatively define a periphery of the semiconductor structure 12. Each of the first corner portion 32, the second corner portion 34, the third corner portion 36, and the fourth corner portion 38 has a radius of curvature that is smaller than the radius of curvature (R1) of the at least one bevel corner portion 40. Additionally, it should be noted that the first short side 31 is the shortest side 30 of the semiconductor structure 12 and has a length of X μm.

In this embodiment, when viewing the transparent conducting layer 14 from above the LED 1, the transparent conducting layer 14 has four sides and four bevel corner portions 40 which cooperatively define a periphery of the transparent conducting layer 14. The four sides include a first side 41, a second side 43, a third side 45, and a fourth side 47 (listed in counterclockwise order). The four bevel corner portions 40 include a first curved corner 42 disposed between the first side 41 and the second side 42, a second curved corner 44 disposed between the second side 43 and the third side 45, a third curved corner 46 disposed between the third side 45 and the fourth side 47, and a fourth curved corner 48 disposed between the fourth side 47 and the first side 41. The first side 41, the second side 43, the third side 45, the fourth side 47, the first curved corner 42, the second curved corner 44, the third curved corner 46, and the fourth curved corner 48 respectively correspond to the first short side 31, the first long side 33, the second short side 35, the second long side 37, the first corner portion 32, the second corner portion 34, the third corner portion 36, and the fourth corner portion 38. When viewing from above the LED 1, a middle point of each of the bevel corner portions 40 has a distance (L1) (see FIG. 4) to a middle point of the corresponding one of the vertex corner portions 50 that ranges from 2 to 150 µm. In some embodiments, the distance (L1) may range from 10 to 115 µm; in other embodiments, the distance (L1) may range from 20 to 90 µm. By increasing the distance (L1), the increase in light output provided by improved current spreading in the transparent conducting layer 14 may exceed the decrease in light output due to light blocking, thereby increasing the EQE of the LED 1, and improve light-emitting performance.

To ensure the current spreading ability of the transparent conducting layer 14, a maximum distance (L2) between the fourth side 47 and the second long side 37 ranges from 2 to 30 µm. In some embodiments, the maximum distance (L2) ranges from 2 to 20 µm.

Referring to FIGS. 3 and 4, in some embodiments, when viewing the first and second electrodes 21, 22 from above the LED 1, the second electrode 22 includes a first main portion 221 and a first extension portion 222, and the first electrode 21 includes a second main portion 211 and a second extension portion 212. The first extension portion 222 is connected to the first main portion 221 and extends from the first main portion 221 toward the first electrode 21. The second extension portion 212 is connected to the second main portion 211 and extends from the second main portion 211 towards the second electrode 22. The above configuration allows current to spread evenly. The first extension portion 222 includes a first straight section 2221, a curved section 2222, and a second straight section 2223, in the stated order along its path of extension from the first main portion 221. The curved section 2222 has a radius of curvature (R2) that is less than the radius of curvature (R1) of a nearest bevel corner portion 40. More specifically a relationship between the radius of curvature (R2) of the curved section 2222 and a radius of curvature (R1) of the nearest one of the bevel corner portion 40 may be described by the relation R1=R2+a, where a is a value that ranges from 90% to 110% of b, and b is a minimum distance (L3) between the second straight section 2223 and the fourth side 47 of the transparent conducting layer 14. This configuration allows the curved section 2222 to maintain a relatively constant distance to the nearest bevel corner portion 40 of the transparent conducting layer 14, and allows an increase in the light output provided by the improved current spreading to exceed the reduction in light output due to increased light blocking, thereby increasing the EQE of the LED 1.

In some embodiments, when viewing the first and second electrodes 21, 22 from above the LED 1, both a thickness of the first straight section 2221 and a thickness of the second straight section 2223 are less than a thickness of the curved section 2222. This configuration takes into consideration of higher charge carrier density near the interfaces between the curved section 2222 and the first straight section 2221 or the second straight section 2223. In other words, the curved section 2222 is relatively wider when viewed from above the LED 1. The relatively wider curved section 2222 provides a larger passage way for the charge carriers and improves the Electrical Overstress (EOS) characteristics of the LED 1, thereby reducing the chance of damage to the LED 1.

In some embodiments, when viewing the semiconductor structure 12 from above the LED 1, the length X is not less than 70 µm and less than 300 µm, and the radii of curvature (R1) of the bevel corner portions 40 ranges from 15 µm to (X/2-20) µm. For example, x may equal 200 µm, while the radii of curvature (R1) of the bevel corner portions 40 ranges from 15 to 80 µm. In some embodiments, when the length X is not less than 300 µm (i.e., X≥300), and the radii of curvature (R1) of the bevel corner portions 40 ranges from 15 µm to (X/3+30) µm. For example, x may equal 600 µm, while the radii of curvature (R1) of the bevel corner portions 40 ranges from 15 to 230 µm. In some embodiments, the radii of curvature (R1) of the bevel corner portions 40 may range from 100 to 180 µm. By varying the radii of curvature (R1) of the bevel corner portions 40 according to the length of the shortest side 30, the increase in light output due to improved current spreading may exceed the reduction in light output due to increased light blocking in the transparent conducting layer 14, and the EQE of the LED 1 may be improved. It should be noted that, if X is less than 70 µm, the coverage of the transparent conducting layer 14 should be made as large as possible, and the reduction to light output due to increased light blocking may be ignored.

In some embodiments, the LED 1 further includes an insulating layer 18 and a current blocking layer 16. The current blocking layer 16 is located between the transparent conducting layer 14 and the second semiconductor layer 125, and is used to prevent vertical current flow from the second electrode 22 into the second semiconductor layer 125 which further enhances the photoelectrical characteristics of the LED 1. The insulating layer 18 covers a portion of an upper surface of the semiconductor structure 12, a side wall of the semiconductor structure 12, and a portion of the transparent conducting layer 14. The first electrode 21 and the second electrode 22 are also partially covered by the insulating layer 18. More specifically, the insulating layer 18 has openings from which the first electrode and the second electrode 21, 22 are exposed for a further wire bonding procedure. The insulating layer 18 provides different functions according to its location. For example, the insulating layer 18 covering the side wall of the semiconductor structure 12 provides electrical insulation which prevents the first semiconductor layer 123 coming into electrical contact with the second semiconductor layer 125 that can cause short circuit in the LED 1. However, this is not a limitation of the disclosure.

In some embodiments, the insulating layer 18 includes a non-conducting material such as an inorganic material or a dielectric material. The inorganic material may include silicone or glass. The dielectric material may include aluminum oxide (AlO), silicon nitride (SiNx), silicon oxide (SiOx), titanium oxide (TiOx), or magnesium fluoride (MgFx). The insulating layer 18 may be made of an electrically insulating material such as silicon dioxide, silicon nitride, titanium oxide, tantalum oxide, niobium oxide, barium titanate, or any combinations of the above. The insulating layer 18 may be made of a combination of the materials given above, and may be structured as a distributed Bragg reflector (DBR) containing alternating layers of two of the materials.

Referring to FIGS. 3, 4 and 5, in order to allow the increase in light output due to improved current spreading to exceed the reduction in light output due to increased light blocking in the transparent layer 14, and to increase the EQE of the LED, the distance (L1) between the middle point of the bevel corner portions and the middle point of the corresponding vertex corner portions 50 may be increased. As mentioned above, when viewing the semiconductor structure 12 and the transparent conducting layer 14 from above the LED 1, the semiconductor structure 12 has at least one side and at least one vertex corner portion 50 connected to the side, and the transparent conducting layer 14 has at least one side and at least one bevel corner portion 40 connected to the side. The side of the semiconductor structure 12 may be the first short side 31, the first long side 33, the second short side 35, or the second long side 37, and the vertex corner portion 50 may be the first corner portion 32, the second corner portion 34, the third corner portion 36, or the fourth corner portion 38. However, the present disclosure is not limited to this configuration, and in other embodiments, the side of the semiconductor structure 12 and the vertex corner portion 50 may be any one of the sides of the semiconductor structure 12 and any one of the corner portions 32, 34, 36, 38 that are connected to each other. The side of the transparent conducting layer 14 may be the first side 41, the second side 43, the third side 45, or the fourth side 47, and the bevel corner portion 40 may be the first curved corner 42, the second curved corner 44, the third curved corner 46 or the fourth curved corner 48. However, the present disclosure is not limited to this configuration, and in other embodiments, the side of the transparent conducting layer 14 and the bevel corner portion 40 may be any one of the sides of the transparent conducting layer 14 and any one of the curved corners 42, 44, 46, 48 that are connected to each other. The at least one side and at least one vertex corner portion 50 of the semiconductor structure 12 correspond to the at least one side and at least one bevel corner portion 40 of the transparent conducting layer 14. The distance (L1) between the middle point of the bevel corner portion 40 and the middle point of the corresponding one of the vertex corner portion 50 may range from 2 to 150 μm, e.g., from 10 to 115 μm or from 20 to 90 μm. By increasing the distance (L1), the increase in light output due to improved current spreading may exceed the reduction in light output due to increased light blocking in the transparent conducting layer 14, thereby enhancing the EQE of the LED 1.

In comparison with the conventional LED as shown in FIGS. 1 and 2, where the ITO layer 70 is made as large as possible to cover as much area of the conventional LED as possible, a distance between a middle portion of the corner portion 71 and a middle portion of the corner portion 73 of the semiconductor structure 72 is smaller than the distance (L1) of the LED 1 of the present disclosure. In the LED 1 of the present disclosure, the area between the bevel corner portion and the corresponding vertex corner portion 50 is analogous to removing a portion of a corner of the ITO layer 70 in the conventional LED. For the removed portion of the ITO layer 70, the associated increase in light output due to improved current spreading is less than the decrease in light output due to increased light blocking. Therefore, with the configuration of this disclosure, the EQE of the LED 1 may be enhanced.

Referring to FIGS. 3 and 4, as mentioned above, when viewing the semiconductor structure 12 from above the LED 1, the semiconductor structure 12 has four sides and four vertex corner portions 50. The four sides include the first short side 31, the first long side 33, the second short side 35, and the second long side 37 (listed in a counterclockwise order). The four vertex corner portions 50 include the first corner portion 32 disposed between the first short side 37 and the first long side 33, the second corner portion 34 disposed between the first long side 33 and the second short side 35, the third corner portion 36 disposed between the second short side 35 and the second long side 37, and the fourth corner portion 38 disposed between the second long side 37 and the first short side 31. The four sides and four vertex corner portions 50 of the semiconductor structure 12 cooperatively define a periphery of the semiconductor structure 12. The transparent conducting layer 14 has four sides and four bevel corner portions 40 that cooperatively define a periphery of the transparent conducting layer 14. The four sides include a first side 41, a second side 43, a third side 45, and a fourth side 47 (listed in counterclockwise order). The four bevel corner portions 40 include a first curved corner 42 disposed between the first side 41 and the second side 42, the second curved corner 44 disposed between the second side 43 and the third side 45, the third curved corner 46 disposed between the third side 45 and the fourth side 47, and the fourth curved corner 48 disposed between the fourth side 47 and the first side 41. The first side 41, the second side 43, the third side 45, the side 47, the first curved corner 42, the second curved corner 44, the third curved corner 46, and the fourth curved corner 48 respectively correspond to the first short side 31, the first long side 33, the second short side 35, the second long side 37, the first corner portion 32, the second corner portion 34, the third corner portion 36, and the fourth corner portion 38. Each of the bevel corner portions 40 has a radius of curvature that is greater than a radius of curvature of the corresponding vertex corner portion 50. This configuration ensures that the increase in light output due to improved current spreading exceeds the decrease in light output due to increased light blocking in the transparent conducting layer 14, thereby enhancing the EQE of the LED 1.

In order to further ensure that the increase in light output due to improved current spreading exceeds the decrease in light output due to increased light blocking in the transparent conducting layer 14, the maximum distance (L2) between the fourth side 47 and the second long side ranges from 2 μm to 30 μm, e.g., 2 μm to 30 μm, each of the bevel corner portions 40 (the first curved corner 42, the second curved corner 44, the third curved corner 46, the third curved corner 46, and the fourth curved corner 48) has a radius of curvature (R1) that ranges from 30 to 200 μm, and each of the vertex corner portions 50 (the first corner portion 32, the second corner portion 34, the third corner portion 36, and the fourth corner portion 38) has a radius of curvature that ranges from 5 to 15 μm.

Referring back to FIGS. 3, 4 and 5, in order to further ensure that the increase in light output due to improved current spreading exceeds the decrease in light output due to increased light blocking in the transparent conducting layer 14, the radius of curvature (R1) of the bevel corner portions 40 may be made larger than the radius of curvature of the corresponding vertex corner portions 50. More specifically, when viewing the semiconductor structure 12 and the transparent conducting layer 14 from above the LED 1, the semiconductor structure 12 has two adjacent sides and one vertex corner portion 50 that is connected between the two adjacent sides of the semiconductor structure 12. The transparent conducting layer 14 has two adjacent sides and one bevel corner portion 40 that is connected between the two adjacent sides of the transparent conducting layer 14. The two adjacent sides of the transparent conducting layer 14 respectively correspond and are parallel to the two adjacent sides of the semiconductor structure 12, and a radius of curvature (R1) of the bevel corner portion 40 is greater than a radius of curvature of the vertex corner portion 50. The two adjacent sides of the semiconductor structure 12 and the vertex corner portion 50 connected between them may take the form of the first short side 31 and the first long side 33 with the first corner portion 32 connected between them, or the first long side 33 and the second short side 35 with the second corner portion 34 connected between them etc. The two adjacent sides of the transparent conducting layer 14 and the bevel corner portion 40 between them may take the form of the first side 41 and the second side 42 with the first curved corner 42 between them, or the second side 43 and the third side 45 with the second curved corner 44 between them etc.

Since there is the concern that the decrease in light output due to increased light blocking from the transparent conducting layer 14 may exceed the increase to light output due to improved current spreading at the portions of the transparent conducting layer 14 away from the second electrode 22. The second electrodes 22 are designed to be centrally positioned relative to the periphery of the transparent conducting layer 14 so that a minimum distance between each point of the second electrode 22 and the periphery of the transparent conducting layer 14 is at least 90% uniform across entire length of said second electrode 22.

Figure 6:
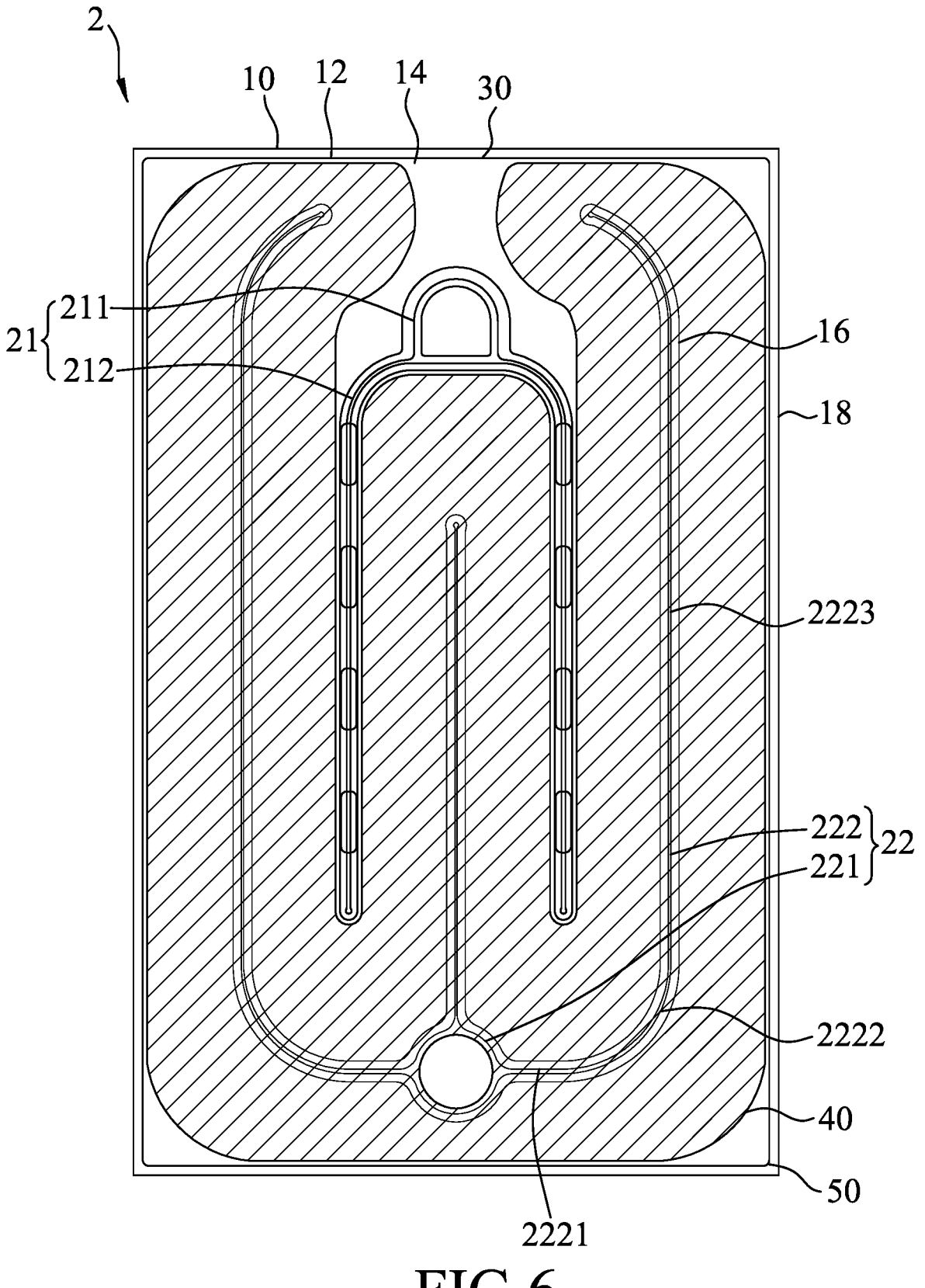
FIG. 6 is a schematic view illustrating an embodiment of the light-emitting diode according to the present disclosure.

Referring to FIG. 6, a second embodiment of the LED 2 according to the present disclosure has a structure similar to the first embodiment, except that in the second embodiment, a portion of the transparent conducting layer 14 near the first electrode 21 (i.e., a portion of the transparent conducting layer 14 near the second main portion 211 but away from the second extension portion 212 of the first electrode 21) is removed. In other words, in the view of FIG. 6, the portion is located above the first electrode 21. For the portion removed from the transparent conducting layer 14, an increase in light output due to improved current spreading is less than a reduction in light output due to increased light blocking, which results in an overall effect of decreasing the light output of the LED 2. Therefore, removing this portion of the transparent conducting layer 14 has the effect of increasing the light output and the EQE of the LED 2. It should be noted that, in the second embodiment, a minimum distance between each point of the second electrode 22 and a nearest portion of the periphery of the transparent conducting layer 14 is at least 90% uniform across the entire length of the second electrode 22.

Figure 7:
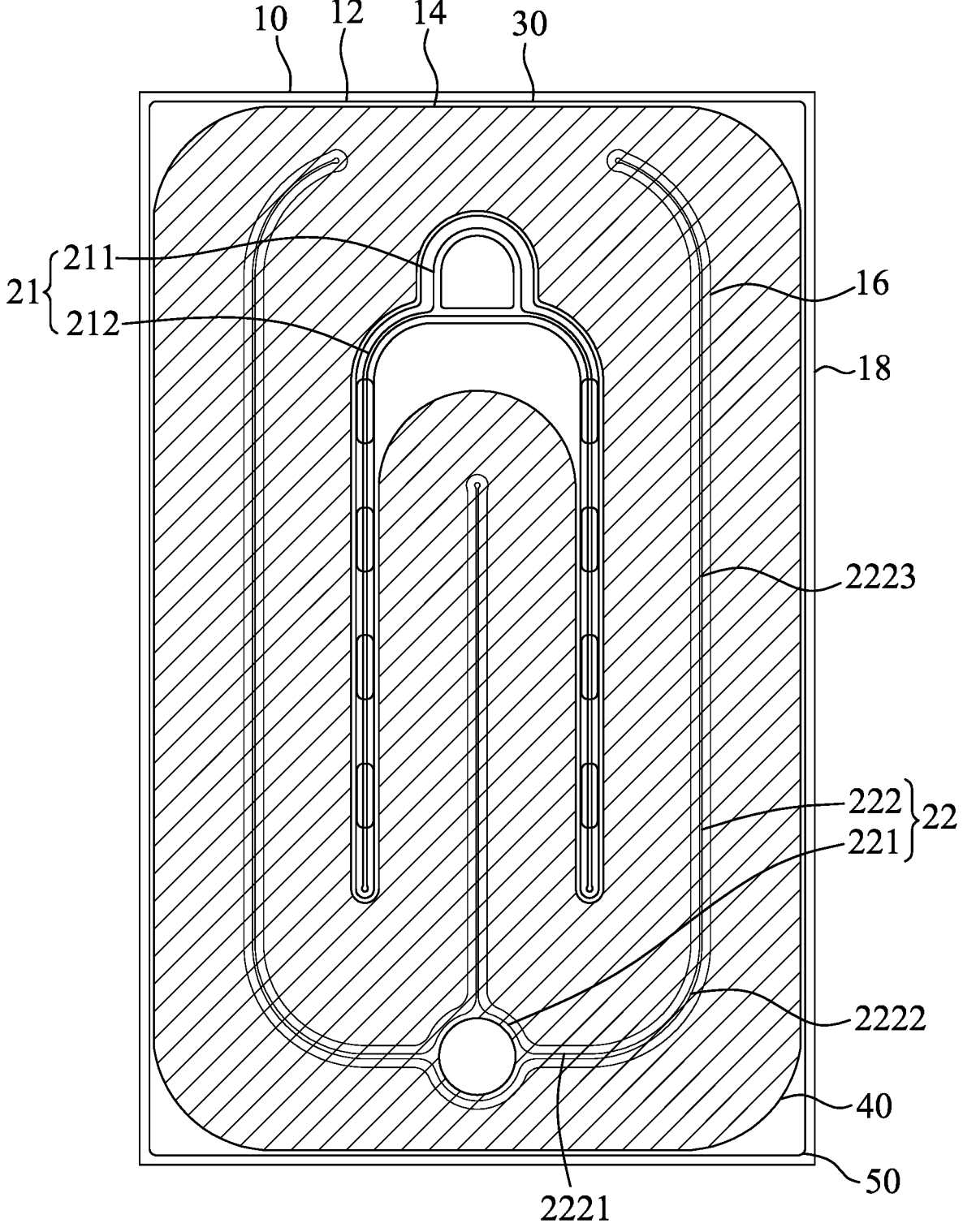
FIG. 7 is a schematic view illustrating an embodiment of the light-emitting diode according to the present disclosure.

Referring to FIG. 7, a third embodiment of the LED 3 according to the present disclosure is similar to the first embodiment of the LED 1 except in that, a portion of the transparent conducting layer 14 near the first electrode 21 (i.e., a portion of the transparent conducting layer 14 close to the second main portion 211 and the second extension portion 212 of the first electrode 21) is removed. In other words, in the view of FIG. 7, the removed portion is below the first electrode 21. The portion removed from the transparent conducting layer 14 is associated with an increase in light output due to improved current spreading that is less than a reduction in light output due to increased light blocking, and has an overall effect of decreasing the light output of the LED 2. Therefore, removing this portion of the transparent conducting layer 14 has the effect of increasing the light output and the EQE of the LED 3. It should be noted that in the third embodiment of the LED 3, a minimum distance between each point of the second electrode 22 and a nearest periphery of the transparent conducting layer 14 is at least 90% uniform across the entire length of the second electrode 22.

Figure 8:
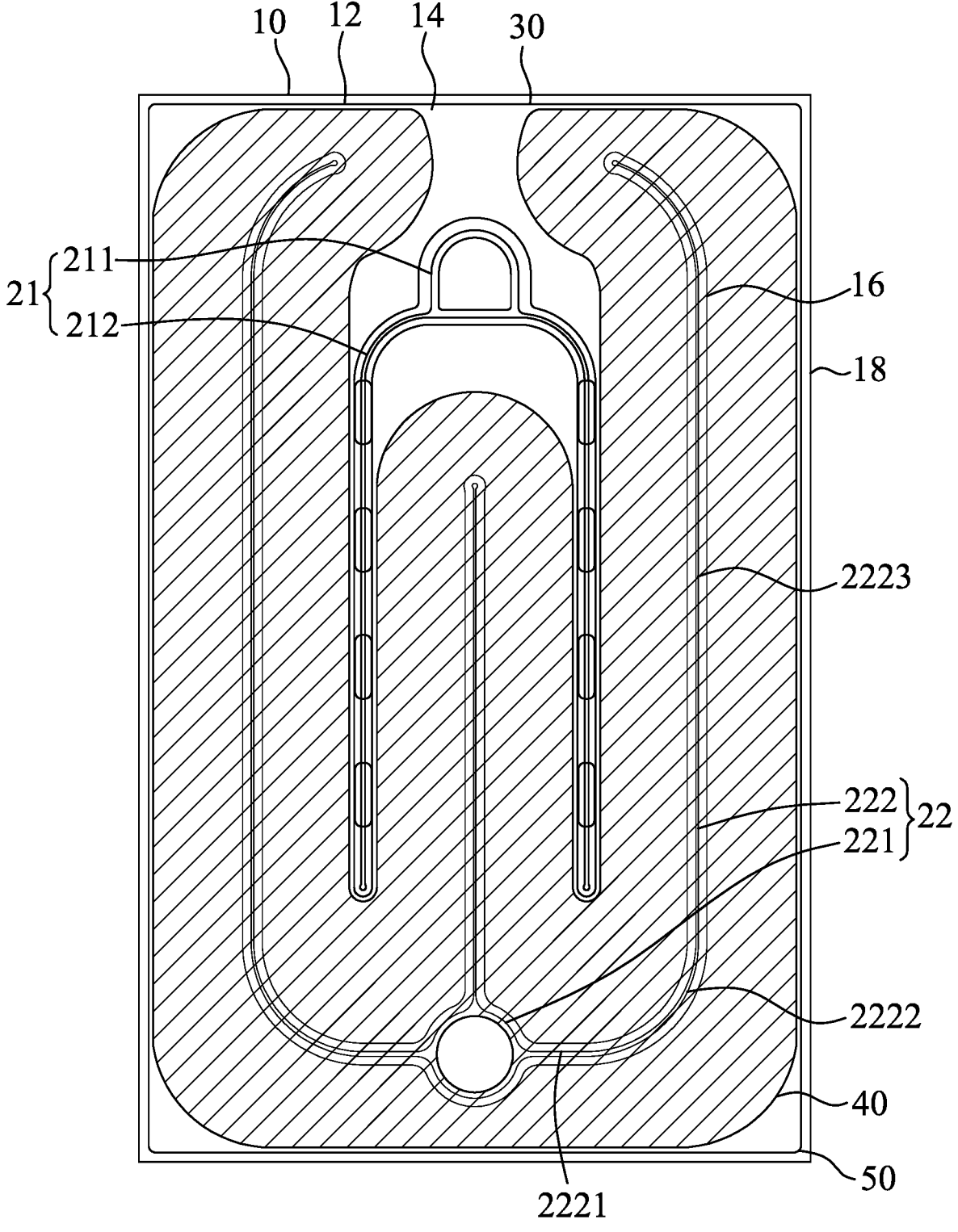
FIG. 8 is a schematic view illustrating an embodiment of the light-emitting diode according to the present disclosure.

Referring to FIG. 8, a fourth embodiment of the LED 4 according to the present disclosure is similar to the first embodiment of the LED 1, except in that a portion of the transparent conducting layer 14 near the first electrode 21 (i.e., a portion of the transparent conducting layer 14 near the second main portion 211, and the second extension portion 212 near the second main portion 211) is removed. In other words, in the view of FIG. 8, the portion removed is located above and below the first electrode 21. The portion removed from the transparent conducting layer 14 has an increase in light output due to improved current spreading that is less than a reduction in light output due to increased light blocking, and has an overall effect of decreasing the light output of the LED 4. Therefore, removing this portion of the transparent conducting layer 14 has the effect of increasing the light output and the EQE of the LED 4. It should be noted that in the fourth embodiment of the LED 4, each point of said second electrode (22) is substantially equidistant to a periphery of said transparent conducting layer 14.

Figure 9:
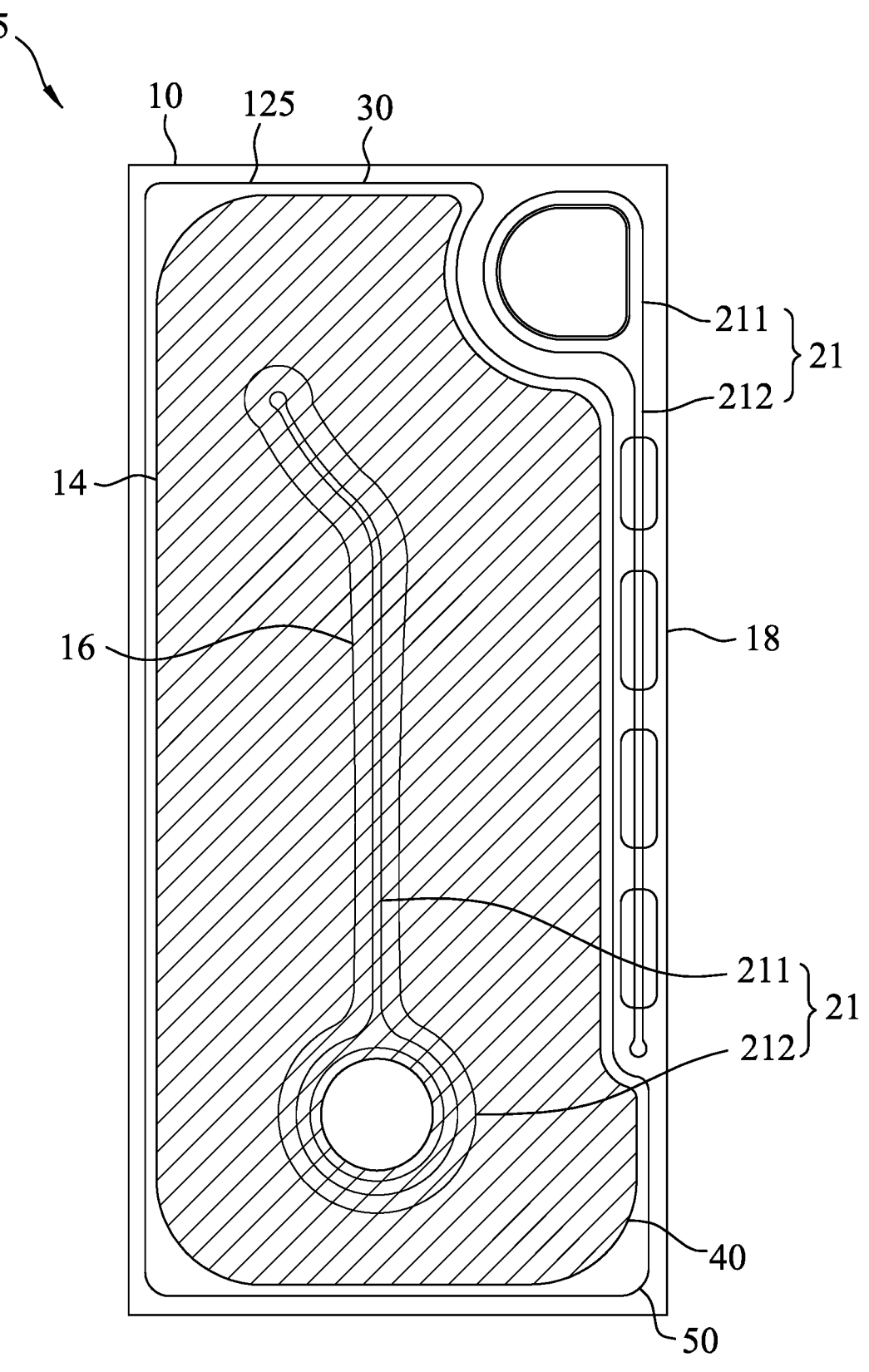
FIG. 9 is a schematic view illustrating an embodiment of the light-emitting diode according to the present disclosure.

Referring to FIG. 9, a fifth embodiment of the LED 5 according to the present disclosure is similar to the first embodiment of the LED 1, except in that the first and second electrodes 21, 22 of the fifth embodiment have a different shape and have a different layout from the first embodiment. When viewing the semiconductor structure 12 from above the LED 5, the first electrode 21 in the fifth embodiment is disposed near a side or a corner of the second semiconductor layer 125, while the first electrode 21 in the first embodiment shown in FIG. 3 is completely surrounded by the second semiconductor layer 125.

Figure 10:
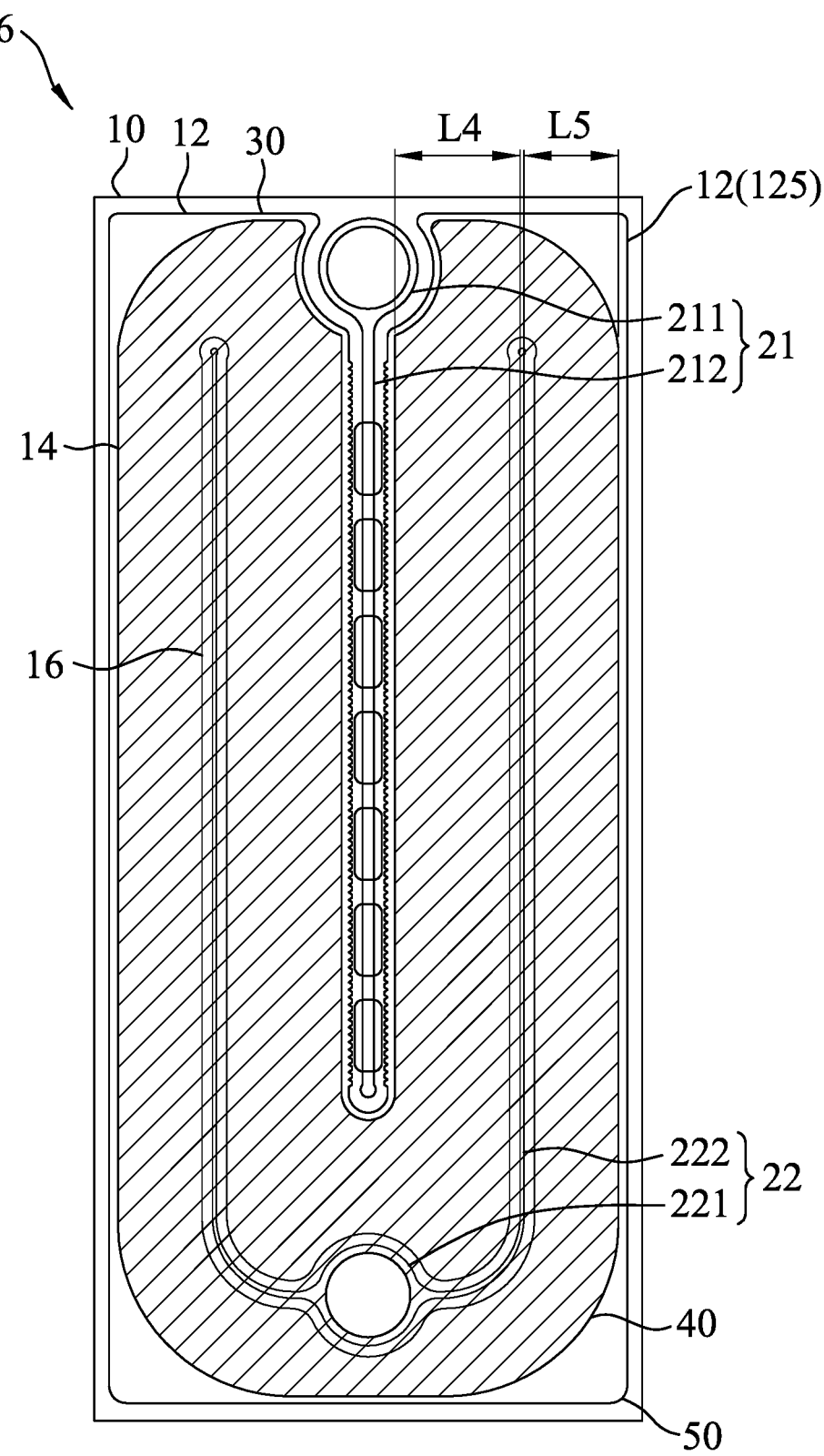
FIG. 10 is a schematic view illustrating an embodiment of the light-emitting diode according to the present disclosure.

Referring to FIG. 10, a sixth embodiment of the LED 6 according to the present disclosure is similar to the first embodiment the LED 1 except in that the first and second electrodes 21, 22 of the sixth embodiment have a different layout from the first embodiment. When viewing the first and second electrodes 21, 22 from above the LED 6, the first electrode 21 in the sixth embodiment is not surrounded by the second semiconductor layer 125, while the first electrode 21 in the first embodiment is completely surrounded by the second semiconductor layer 125.

In the sixth embodiment, the first electrode 21 and the second electrode 22 together have 3 extension portions which may be referred to as finger portions, and the sixth embodiment is a particularly suitable configuration for the case where the length X of the shortest side 30 of the semiconductor structure 12 is small. More specifically, in the sixth embodiment, X is not less than 70 μm and less than 300 μm, and the radius of curvature (R1) of the bevel corner portions 40 ranges from 15 to (X/2-20) μm. This is in contrast to the first to fourth embodiments, where the first and second electrodes 21, 22 of the LED 1, 2, 3, 4 together have 5 finger portions, and those are more suitable configurations for the case where the length X of the shortest side 30 is larger, for example, X is not less than 300 μm, and the radius of curvature (R1) of the bevel corner portion 40 may range from 15 μm to (X/3+30) μm.

In this embodiment, the number of the second extension portion 212 of the first electrode 21 is one, and the number of the first extension portion 222 of the second electrode 22 is two. The first electrode 21 is disposed to divide a part of the second semiconductor layer 125 into two half portions which are connected by another part of the second semiconductor layer 125. Corresponding to the structure of the second semiconductor layer 125, the transparent conducting layer 14 also has two half portions. The transparent conducting layer 14 has an inner periphery that is adjacent to the first electrode 21 and an outer periphery near a periphery of the LED 6. In the sixth embodiment, when viewing the semiconductor structure 12, the first and second electrodes 21, 22, and the transparent conducting layer 14 from above the LED 6, a minimum distance (L4) between each point of the second electrode 22 and the inner periphery of the transparent conducting layer 14 that is closest to the first electrode 21 is at least 90% uniform across the entire length of the second electrode 22, and a minimum distance (L5) between each point of the second electrode 22 and the outer periphery of the transparent conducting layer 14 is at least 90% uniform across the entire length of the second electrode 22. In some embodiments, the minimum distance (L4) may be different from the minimum distance (L5). This is due to the transparent conducting layer 14 near the first electrode 21 being closer to the second semiconductor layer 125 (see the transparent conducting layer 14 near first electrode 21), and the transparent conducting layer 14 further away from the first electrode 21 (see the transparent conducting layer 14 near the periphery of the LED 6) being more distant to the second semiconductor layer 125. This configuration allows the increase in light output due to improved current spreading to exceed the decrease in light output due to light blocking in the transparent conducting layer 14.

Referring to FIGS. 11, 12, 13 and 14, a seventh embodiment of the LED 7 according to the present disclosure is similar to the first embodiment of the LED 1 except in that, when viewing the transparent conducting layer 14 from above the LED 7, the transparent conducting layer 14 has a near side 62 and a far side 64. A minimum distance between the near side 62 and the first electrode 21 is less than a minimum distance between the far side 64 and the first electrode 21. A minimum distance between the near side 62 and the second semiconductor layer 125 is less than a minimum distance between the far side 64 and the second semiconductor layer 125. In some embodiments, the minimum distance between the near side 62 and the second semiconductor layer 125 ranges from 2 to 5 μm, and the minimum distance between the far side 64 and the second semiconductor layer 125 ranges between 6 to 20 μm. A minimum distance between the transparent conducting layer 14 and the first electrode 21 is equal to the distance between the near side 62 to the first electrode 21. In other words, the near side 62 is the side of the transparent conducting layer 14 that is closest to the first electrode 21 (represented by the line between A and B in FIG. 12), while the other sides of the transparent conducting layer 14 are further away from the first electrode 21 and they are the far sides 64. Therefore the far sides 64 are all the other sides of the transparent conducting layer 14 with the exception of the near side 62, in other words, the transparent conducting layer 14 only has the near side 62 and the far sides 64.

Figure 12:
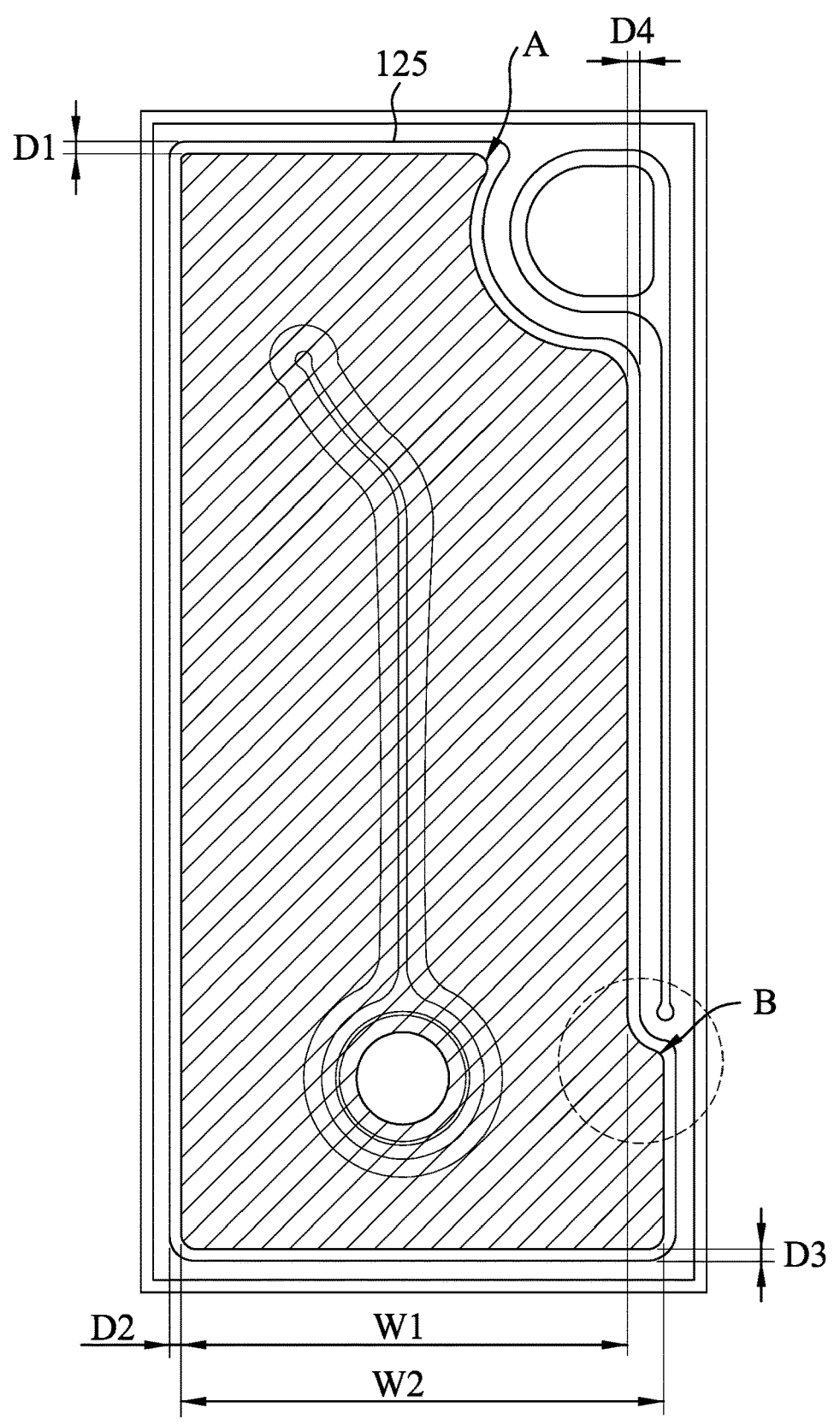
FIG. 12 is a schematic view showing dimensions of the embodiment in FIG. 11.
Figure 13:
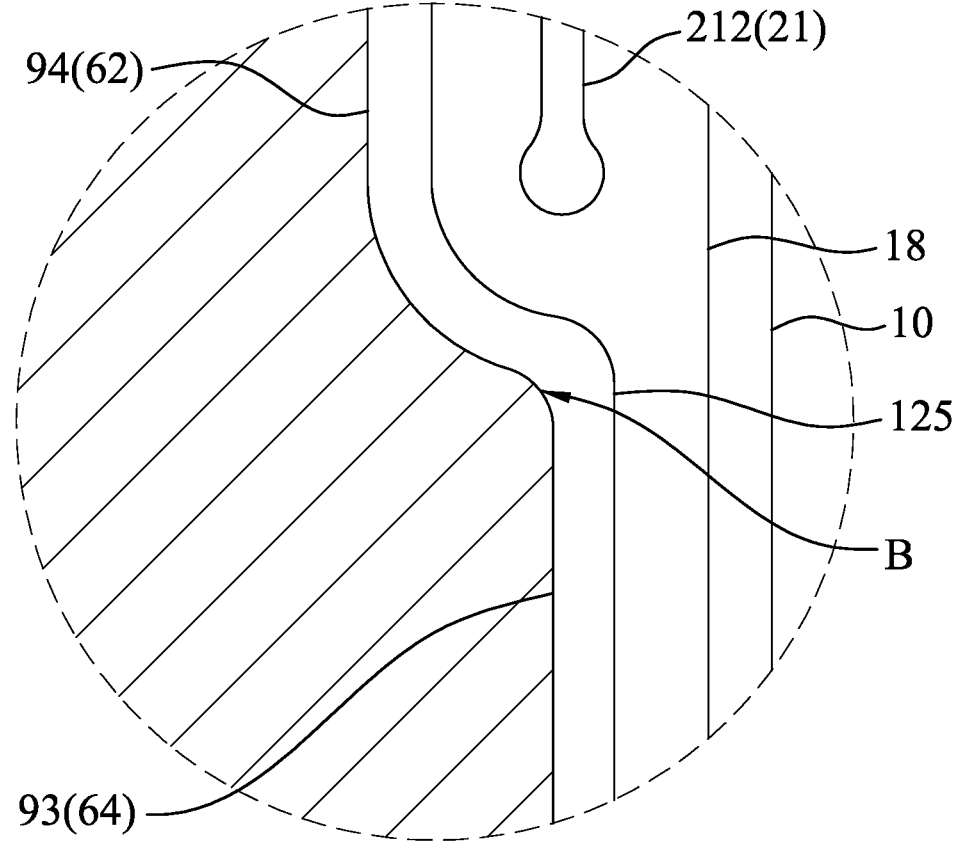
FIG. 13 is a fragmentary enlarged schematic view of the embodiment in FIG. 12.
Figure 14:
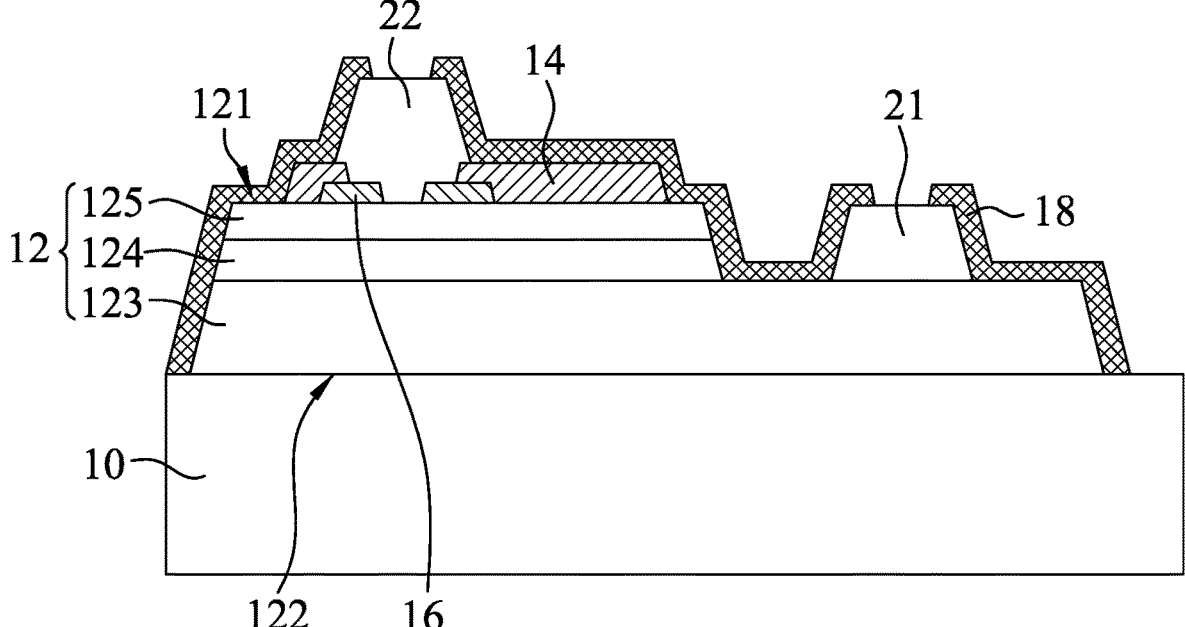
FIG. 14 is a schematic cross-sectional view illustrating the embodiment in FIG. 11.

From FIG. 12, it may be observed that, the minimum distance between the near side 62 and the second semiconductor layer 125 is less than the minimum distance between the far sides 64 and the second semiconductor layer 125. In other words, the far sides 64 of the transparent semiconductor layer 14 are farther away from the second semiconductor layer 125 relative to the near side 62. In some embodiments, the minimum distance to the first electrode 21 from every point of the near side 62 is the same.

By virtue of making the far sides 64 of the transparent conducting layer 14 further away from the second semiconductor layer 125, thereby optimizing the size of the transparent conducting layer 14 which is an improvement upon the conventional LED design of maximizing the ITO layer 70, the EQE and wall plug efficiency (WPE) of the LED 7 may be increased. This is due to the reduced current spreading effectiveness at the far sides 64 of the transparent conducting layer 14 relative to the near side 62, if the transparent conducting layer 14 were to be increased in size at this area, the increase in light output due to improved current spreading will not exceed the reduction in light output due to increased light blocking, which will lead to an overall effect of decreasing light output and EQE of the LED 7. The is due to current spreading at the far sides 64 of the transparent conducting layer 14 being less effective relative to the near side 62. Increasing the size of the transparent conducting layer 14 in this area will lead to reduction in light output due to light blocking exceeding the increase in light output due to improved current spreading and lead to an overall decrease in light output and EQE of the LED 7. In some embodiments, the minimum distance between the near side 62 and the second semiconductor layer 125 may be less than at least 80% of the minimum distance between the far side 64 and the second semiconductor layer 125, which effectively increases EQE, WPE, and light output characteristics. This is because although the light spreading is less effective at the far side 64 of the transparent conducting layer 14, increasing the distance between the far side 64 and the second semiconductor layer 125 still reduces the size of the transparent conducting layer 14. However, it should be noted that if the area reduction of the transparent conducting layer 14 happens at the far side 64 close to the second electrode 22, it would be counterproductive since the current spreading improvement at this area is adequate. Therefore, some of the far side 64 of the transparent conducting layer 14 near the second electrode 22 should be preserved in order to improve the EQE of the LED 7.

In some embodiments, considering electrical characteristics and light absorption of the transparent conducting layer 14, the minimum distance between the short side 62 and the second semiconductor layer 125 may range from 2 μm to 10 μm, and the minimum distance between the far sides 64 to the second semiconductor layer 125 may range from 3 μm to 30 μm. In some embodiments, the minimum distance between the near side 62 and the second semiconductor layer 125 ranges from 2 μm to 5 μm, and the minimum distance between the far sides 64 and the second semiconductor layer 125 ranges from 6 μm to 20 μm. Within such ranges, the EQE of the LED 7 could be improved.

Figure 11:
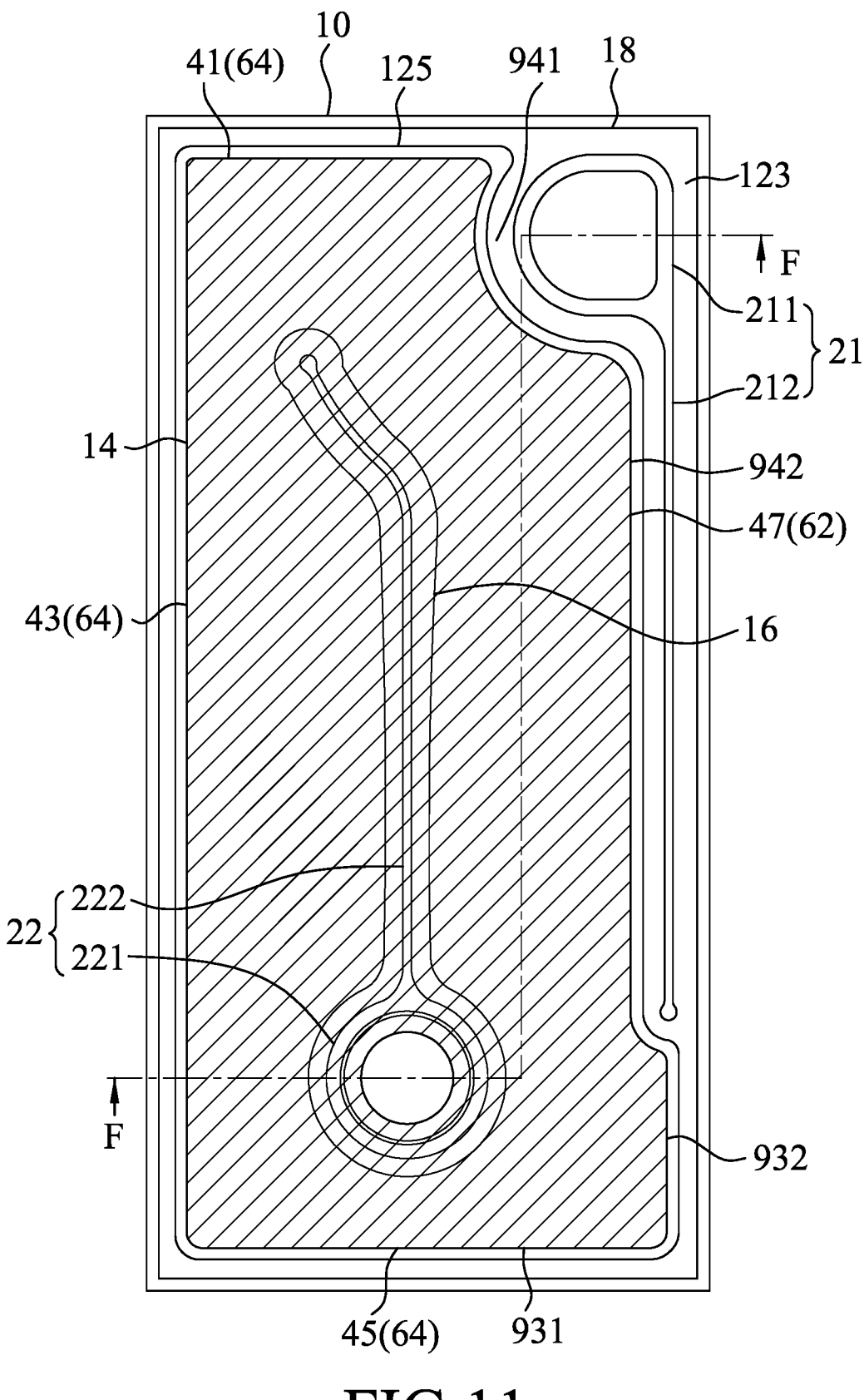
FIG. 11 is a schematic view illustrating an embodiment of the light-emitting diode according to the present disclosure.

Referring to FIGS. 11 and 12, in this embodiment, when viewing the transparent conducting layer 14 from above the LED 7, the transparent conducting layer 14 has four sides, i.e., a first side 41, a second side 43, a third side 45, and a fourth side 47 (stated in counterclockwise order). A first distance (D1) is a minimum distance between the first side 41 and the second semiconductor layer 125. A second distance (D2) is a minimum distance between the second side 43 and the second semiconductor layer 125. A third distance (D3) is a minimum distance between the third side 45 and the second semiconductor layer 125. A fourth distance (D4) is a minimum distance between the fourth side 47 and the second semiconductor layer 125. The first distance (D1), the second distance (D2), the third distance (D3) are all greater than the fourth distance (D4). In other words, the fourth side 47 is closer to the first electrode 21 in comparison to the first side 41, the second side 43, the third side 45 and the fourth side 47. That is to say, the fourth side 47 is the near side 62 of the transparent conducting layer 14, and the first side 41, the second side 43, and the third side 45 are the far sides 64 of the transparent conducting layer 14.

In some embodiments, the first distance (D1), the second distance (D2), and the third distance (D3) are the same; however, this is not a limitation of the disclosure, and the first distance (D1), the second distance (D2), and the third distance (D3) may be different. As long as the fourth distance (D4) is shorter than the first distance (D1), the second distance (D2), and the third distance (D3), the EQE and the WPE of the LED 7 may be increased, thereby improving light output performance of the LED 7. In some embodiments, the fourth distance (D4) may be shorter than the first distance (D1). The fourth distance (D4) may be shorter than the first distance (D1) by 1 μm to 28 μm, e.g., 1 μm, 2 μm, 3 μm, or 5 μm.

In some embodiments, the first electrode 21 may include a second main portion 211 and a second extension portion 212. The second main portion 211 is connected to the second extension portion 212. When viewing the first electrode 21 from above the LED 7, the second extension portion 212 extends from the second main portion 211 toward the second electrode 22, thereby providing uniform current spreading. In some embodiments, the second extension portion 212 has a strip structure. The second electrode 22 may include a first main portion 221 and a first extension portion 222 that is connected to the first main portion 221 and that extends from the first main portion 221 toward the second main portion 211, thereby providing even current spreading.

Referring to FIGS. 11 and 12, in some embodiments, when viewing from above the LED 7, the fourth side 47 includes a curved section 941 and a straight section 942, and the third side 45 includes a long section 931 and a short section 932. The straight section 942 of the fourth side 47 has two ends that are respectively connected to the curved section 941 and the short section 932 of the third side 45. The long section 931 of the third side 45 has two ends that are respectively connected to the short section 932 and the second side 43. In other words, the long section 931 and the short section 932 of the third side 45, and the straight section 942 and the curved section 941 of the fourth side 47 form a contiguous section of the outer periphery of the transparent conducting layer 14. Furthermore, the short section 932 of the third side 45 is parallel to the straight section 942 of the fourth side 47, thereby providing improved light output characteristics of the LED 7. More specifically, a first horizontal distance (W1) between the straight section 942 of the fourth side 47 and the second side 43 is shorter than a second horizontal distance (W2) between the short section 932 of the third side 932 and the second side 43. A difference between the first horizontal distance (W1) and the second horizontal distance (W2) is the distance by which the short section 932 projects from the straight section 932. The first horizontal distance (W1) is shorter than the second horizontal distance (W2) by 1 to 25 μm. For example, in some embodiments, the first horizontal distance (W1) may be shorter than the second horizontal distance (W2) by 1 μm, 2 μm or 3 μm. Since the short section 932 of the third side 45 is relatively further away from the first electrode 21 and thus has inferior current spreading, increasing the size of the transparent conducting layer 14 will result in a net decrease of the light output since the reduction of light output due to light blocking will exceed the increase in light output due to improved current spreading, and lead to a decrease of EQE in the LED 7. A minimum distance between the straight section 942 to the second semiconductor layer 125 is less than a minimum distance between the short side 932 to the second semiconductor layer 125. In some embodiments, when viewing from above the LED 7, area of the transparent conducting layer 14 gradually decreases in a direction from the second electrode 22 along the first extension portion 222 toward the first electrode 21, thereby providing improved light output characteristics.

Figure 15:
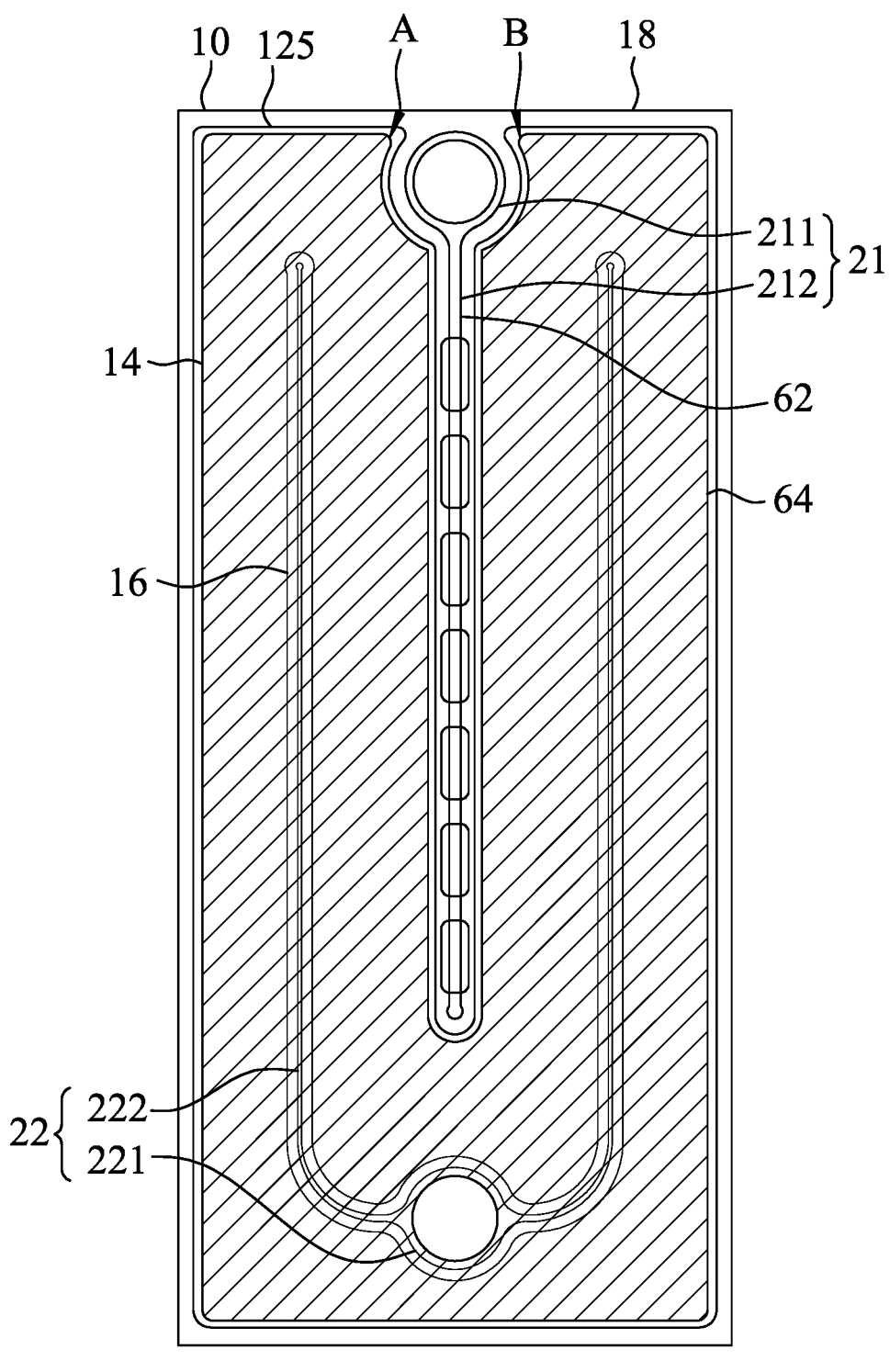
FIG. 15 is a schematic view illustrating an embodiment of the light-emitting diode according to the present disclosure.

Referring to FIG. 15, an eighth embodiment of an LED 8 according to the present disclosure is similar to the seventh embodiment except in that, the layout of the first electrode 21 is different. In the eighth embodiment, when viewing from above the LED 8, the first electrode 21 is substantially located along a center line of the semiconductor structure 12, and thus, shape of the transparent conducting layer 14 is changed. The transparent conducting layer 14 has two half portions that are separated from each other, and the first electrode 21 extends between the two half portions. In the eighth embodiment, the transparent conducting layer has the near side 62, and the far side 64. A minimum distance between the near side 62 and the first electrode 21 is less than a minimum distance between the far side 64 and the first electrode 21. More specifically, in FIG. 15, the line section of the transparent conducting layer 14 extending between points A and B and around the first electrode 21 is the near side 62. The minimum distance between the near side 62 and the second semiconductor layer 125 is less than the minimum distance between the far side 64 and the second semiconductor layer 125, thereby improving the light output characteristics of the LED 8.

Figure 16:
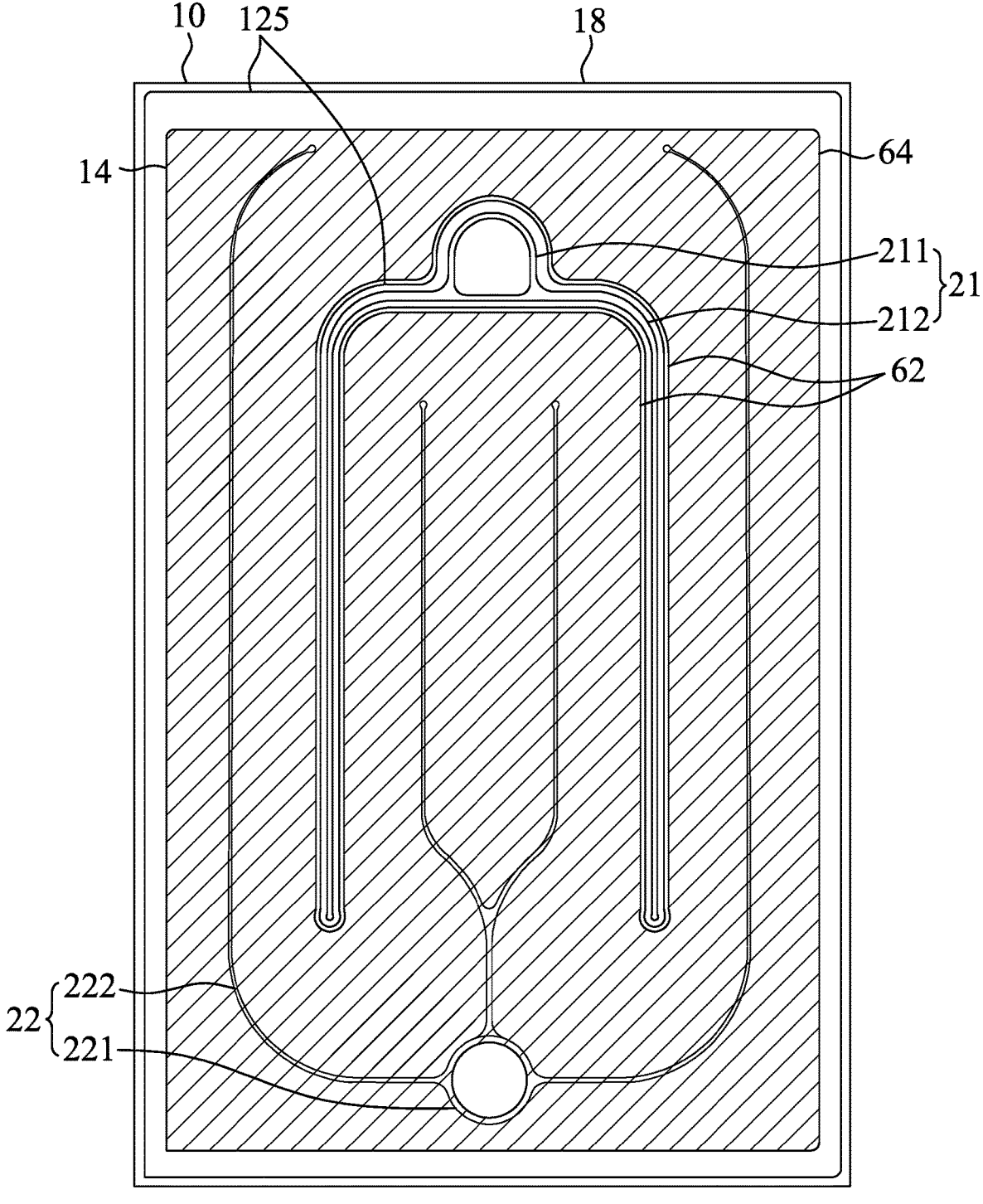
FIG. 16 is a schematic view illustrating an embodiment of the light-emitting diode according to the present disclosure.

Referring to FIG. 16, a ninth embodiment of an LED 9 according to the present disclosure is similar to the seventh embodiment. However, the ninth embodiment is different from the seventh embodiment in that the placement of the first electrode 21 is different. In this embodiment, the first electrode 21 is completely surrounded by the second semiconductor layer 125. Additionally, when viewing the first electrode 21 from above the LED 9, the second main portion 211 of the first electrode 21 is located along the center line of the semiconductor structure 12, and the first electrode 21 has two of the second extension portions 212 extending from left and right sides of the second main portion 211 and extending toward the first main portion 221 of the second electrode 22. Therefore, in the ninth embodiment, the transparent conducting layer 14 has a different shape. However, the transparent conducting layer 14 still has the near side 62 and the far side 64. When viewing the transparent conducting layer 14 from above the LED 9, the near side 62 of the transparent conducting layer 14 is an enclosed ring surrounding the first electrode 21. Because the first electrode 21 is completely surrounded by the second semiconductor layer 125, the near side 62 is the inner periphery of the transparent conducting layer 14, and the far side 64 is the outer periphery of the transparent conducting layer 14 (near the periphery of the LED 9). The minimum distance between the near side 62 to the first electrode 21 is smaller than the minimum distance between the far side 64 to the first electrode 21, a minimum distance between the near side 62 and an edge of the second semiconductor layer 125 is smaller than the minimum distance between the far side 64 and the edge of the second semiconductor layer 125. The light output characteristics of the LED 9 are improved with this configuration.

Figure 17:
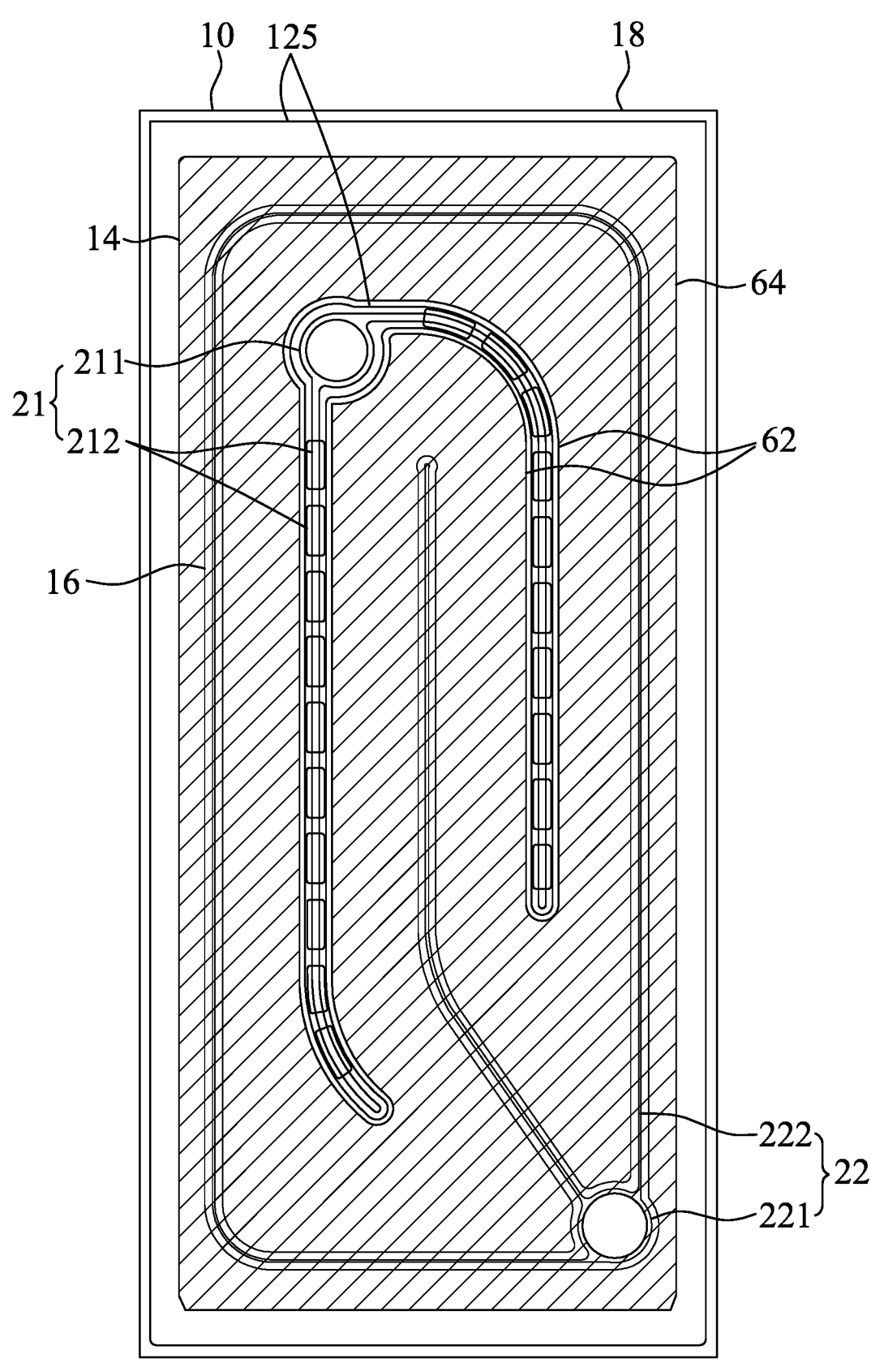
FIG. 17 is a schematic view illustrating an embodiment of the light-emitting diode according to the present disclosure.

Referring to FIG. 17, a tenth embodiment of the LED 10 according to the present disclosure is similar to the LED 7 of the seventh embodiment (shown in FIG. 11). However, the LED 10 is mainly different from the seventh embodiment in that the layout of the first electrode 21 is different. In the tenth embodiment, the first electrode 21 is completely surrounded by the second semiconductor layer 125, and the second main portion 211 of the first electrode 21 is not located on a center line of the semiconductor structure 12, and has two second extension portions 212 extending from the second main portion 211 towards the first main portion 221 of the second electrode 22. Therefore, in the tenth embodiment, the transparent conducting layer 14 has a different shape. In this embodiment, the transparent conducting layer 14 has the near side 62 and the far side 64. In this embodiment, when viewing the transparent conducting layer 14 from above the LED 10, the near side 62 is an enclosed ring surrounding the first electrode 21. In this embodiment, because the first electrode 21 is completely surrounded by the second semiconductor layer 125, the near side 62 is the inner periphery of the transparent conducting layer 14, and the far side 64 is the outer periphery (near the periphery of the LED 10) of the transparent conducting layer 14. A minimum distance between the near side 62 to the first electrode 21 is smaller than a minimum distance between the far side 64 to the first electrode 21, and a distance between the near side 62 and an edge of the second semiconductor layer 125 is smaller than a minimum distance between the far side 64 and the edge of the second semiconductor layer 125. The light output characteristics of the LED 10 are improved with this configuration.

Figure 18:
FIG. 18 is a schematic view illustrating an embodiment of the light-emitting diode according to the present disclosure.

Referring to FIG. 18, a eleventh embodiment of the LED 11 according to the present disclosure is similar to the seventh embodiment LED 7 except in that, the layout of the second electrode 22 is different, and the first electrode 21 does not have the second extension portion 212. However, in the eleventh embodiment, the transparent conducting layer 14 still has the near side 62 and the far side 64. In the eleventh embodiment, referring to FIG. 18, the near side 62 is illustrated as a side of the transparent conducting layer 14 between the points A and B. A minimum distance between the near side 62 to the first electrode 21 is smaller than a minimum distance between the far side 64 and the first electrode 21. A distance between the near side 62 and an edge of the second semiconductor layer 125 is smaller than a minimum distance between the far side 64 and the edge of the second semiconductor layer 125, thereby improving the light output characteristics of the LED 11.

Figure 19:
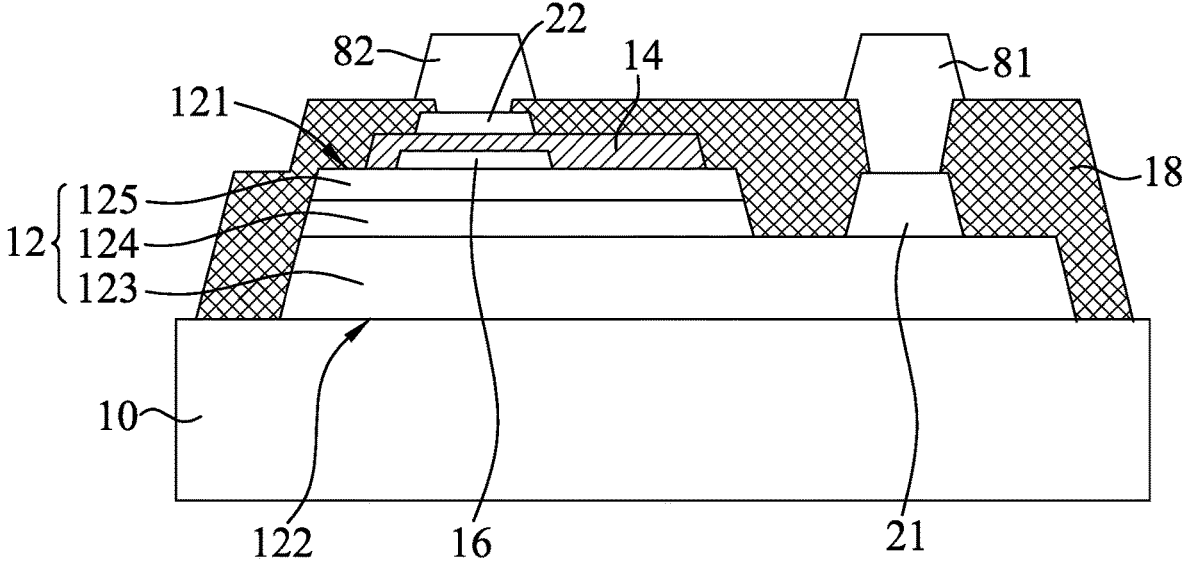
FIG. 19 is a schematic cross-sectional view illustrating an embodiment of the light-emitting diode according to the present disclosure.
Figure 20:
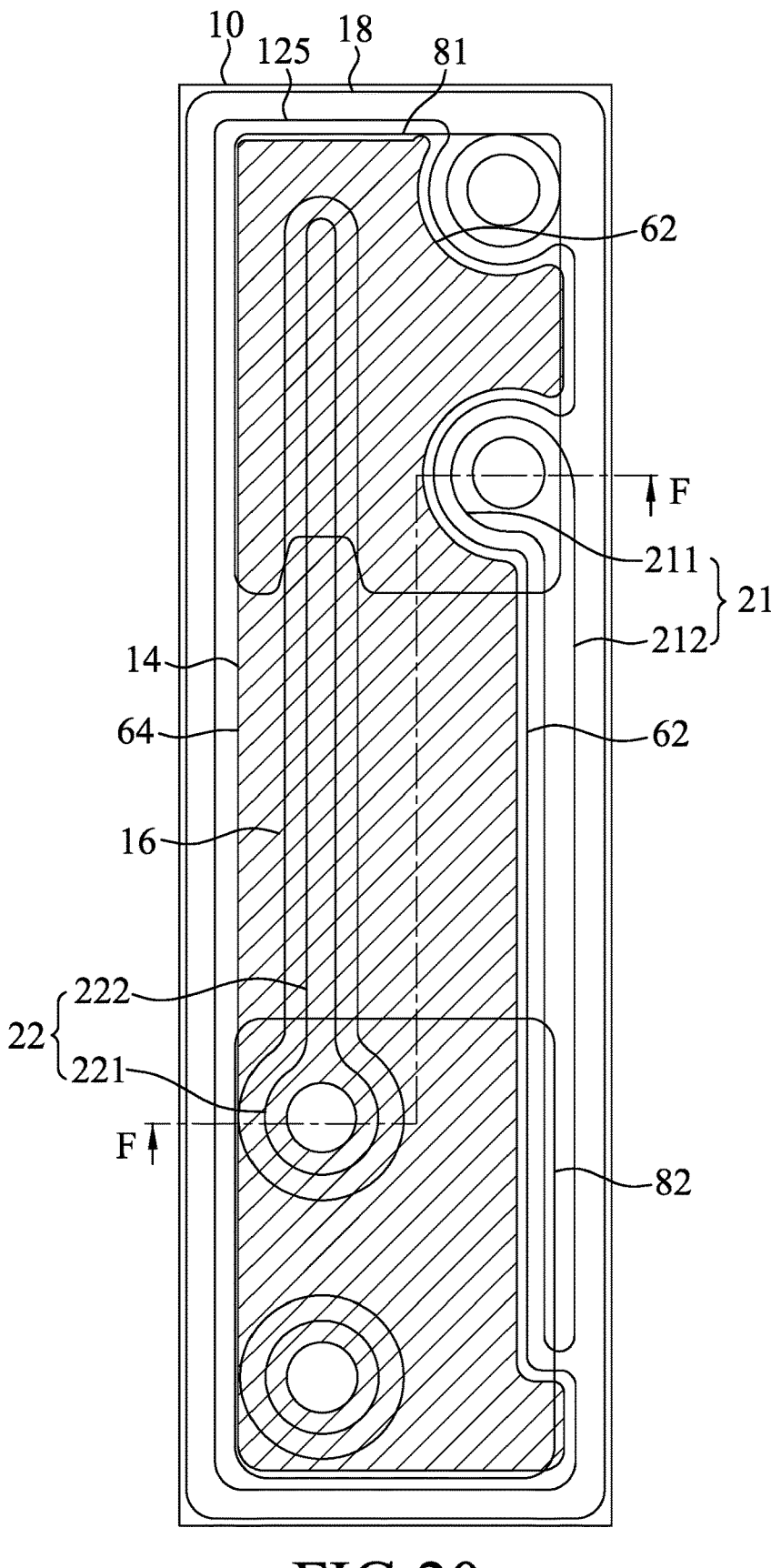
FIG. 20 is a schematic view of the embodiment shown in FIG. 19.

Referring to FIGS. 19 and 20, a twelfth embodiment of the LED 12 according to the present disclosure is similar to the LED 7 of the seventh embodiment. The twelfth embodiment is mainly different from the seventh embodiment in that the LED 12 in this embodiment has a flip-chip structure and includes a first electrode pad 81 and a second electrode pad 82. The first electrode pad 81 and the second electrode 82 are respectively connected to the first electrode 21 and the second electrode 22 via openings of the insulating layer 18. Additionally, it should be noted that the first electrode 21 of the twelfth embodiment has a multi-section structure, therefore the near side 62 of the transparent conducting layer 14 may also be multi-sectioned like the first electrode 21.

A light-emitting device according to this disclosure may include the LED 1, 2, 3, 4, 5, 6, 7, 8, 9, 10, 11, 12 in any one of the embodiments of the present disclosure. The light-emitting device may be a Micro LED, a Mini LED or a standard LED. The LEDs 1, 2, 3, 4, 5, 6, 7, 8, 9, 10, 11, 12 according to the disclosure may be used in back lighting display or the RGB display. A light-emitting device with small dimensions may contain hundreds or thousands of LEDs 1, 2, 3, 4, 5, 6, 7, 8, 9, 10, 11, 12 mounted on a substrate or package substrate to form the light source of a backlighting device or RGB display.

The bevel corner portion 40 and the vertex corner portion 50 may be a curved shape. The LEDs 1, 2, 3, 4, 5, 6, 7, 8, 9, 10, 11, 12 of the disclosure are suitable for both flip-chip and face-up designs. It should be noted that due to the differences in photoresists or other factors, portions and components of the LED 1, 2, 3, 4, 5, 6, 7, 8, 9, 10, 11, 12 that are drawn to be straight in the figures may not actually be completely straight when fabricated, the disclosure includes the possibility of minor warpage or bulging. Additionally, it should be noted that the LEDs 7, 8, 9, 10, 11, 12 of the seventh to twelfth embodiments in the disclosure are more efficient when operated under a current density of 0.5 A/mm 2 or less. In this disclosure, the terms "are the same" and "are equal to" should be understood in an expansive sense (not requiring exact similitude). A 0.1 μm margin of error is generally understood to apply when using these terms. For example, 1 μm and 1.1 μm should still qualify as "equal" or "the same" in the present disclosure.

In summary of the above, in the LED 1, 2, 3, 4, 5, 6, 7, 8, 9, 10, 11, 12 and light-emitting device according to the present disclosure, by virtue of optimizing the size transparent conducting layer 14 by increasing the radius of curvature (R1) of the bevel corner portion 40 of the transparent conducting layer 14, increasing the distance (L1) between the middle point of the bevel corner portion 40 and the middle point of the vertex corner portion 50, or increasing the distance between the far side 64 of the transparent conducting layer 14 near the first electrode 21 to the second semiconductor layer 12, instead of trying to maximize the size of the ITO layer 70 in accordance with conventional design philosophy, the increase in light output due to improved current spreading may exceed the decrease in light output due to light blocking by the transparent conducting layer 14 and thereby increase light output characteristics, EQE and WPE of the LED 1, 2, 3, 4, 5, 6, 7, 8, 9, 10, 11, 12.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A Light-emitting diode (LED) comprising:
    a semiconductor structure having a lower surface and an upper surface, and including a first semiconductor layer, an active layer, and a second semiconductor layer that are sequentially stacked in a laminating direction from said lower surface to said upper surface;

a transparent conducting layer located on said second semiconductor layer;

a first electrode located on said first semiconductor layer; and a second electrode located on said transparent conducting layer;

wherein when viewing said semiconductor structure and said transparent conducting layer from above said LED, said semiconductor structure has a shortest side with a length of X μm, and said transparent conducting layer has at least one bevel corner portion that has a radius of curvature (R1) ranging from 15 to X/2 μm.

2. The LED as claimed in claim 1, wherein said semiconductor structure has at least one vertex corner portion, said radius of curvature (R1) of said at least one bevel corner portion being greater than a radius of curvature of said at least one vertex corner portion.

3. The LED as claimed in claim 2, wherein said radius of curvature (R1) of said at least one bevel corner portion ranges from 30 to 200 μm; and said radius of curvature of said at least one vertex corner portion ranges from 5 to 15 μm.

4. The LED as claimed in claim 1, wherein:

when viewing said semiconductor structure from above said LED, said semiconductor structure has four sides that includes a first short side, a first long side, a second short side, and a second long side, and four vertex corner portions that include a first corner portion disposed between said first short side and said first long side, a second corner portion disposed between said first long side and said second short side, a third corner portion disposed between said second short side and said second long side, and a fourth corner portion disposed between said second long side and said first short side;

each of said first corner portion, said second corner portion, said third corner portion, and said fourth corner portion having a radius of curvature that is smaller than said radius of curvature (R1) of said at least one bevel corner portion; and said first short side is said shortest side having the length of X μm.

5. The LED as claimed in claim 4, wherein:

when viewing said transparent conducting layer from above said LED, said transparent conducting layer has four sides that include a first side, a second side, a third side, and a fourth side, and four of said bevel corner portions that include a first curved corner disposed between said first side and said second side, a second curved corner disposed between said second side and said third side, a third curved corner disposed between said third side and said fourth side, and a fourth curved corner disposed between said fourth side and said first side;

said first side, said second side, said third side, said fourth side, said first curved corner, said second curved corner, said third curved corner, and said fourth curved corner respectively correspond to said first short side, said first long side, said second short side, said second long side, said first corner portion, said second corner portion, said third corner portion, and said fourth corner portion; and when viewing said semiconductor structure from above said LED, a middle point of each of said bevel corner portions has a distance (L1) to a middle point of said corresponding one of said vertex corner portions that ranges from 2 to 150 μm, and a maximum distance (L2) between said fourth side and said second long side ranges from 2 to 30 μm.

6. The LED as claimed in claim 1, wherein:

when viewing said semiconductor structure from above said LED, said second electrode includes a first main portion, and a first extension portion that is connected to said first main portion, that extends from said from said first main portion toward said first electrode, and that includes a first straight section, a curved section, and a second straight section; and said curved section has a radius of curvature (R2) that is less than said radius of curvature (R1) of said at least one bevel corner portion.

7. The LED as claimed in claim 6, wherein R1=R2+a; where a is a value that ranges from 90% to 110% of b, and b is a distance (L3) between said second straight section and said fourth side of said transparent conducting layer.

8. The LED as claimed in claim 6, wherein both a thickness of said first straight section and a thickness of said second straight section are less than a thickness of said first curved section.

9. The LED as claimed in claim 1, wherein when viewing said semiconductor structure from above said LED, a minimum distance between each point of said second electrode and a periphery of said transparent conducting layer is at least 90% uniform across entire length of said second electrode.

10. The LED as claimed in claim 1, wherein each point of said second electrode is equidistant to a periphery of said transparent conducting layer.

11. The LED (1) as claimed in claim 1, wherein X is not less than 70 μm and less than 300 μm, and said radius of curvature of said bevel corner portion ranging from 15 μm to (X/2-20) μm.

12. The LED as claimed in claim 1, wherein X is not less than 300 μm, and said radius of curvature (R1) of said bevel corner portion ranges from 15 μm to (X/3+30) μm.

13. A light-emitting diode (LED) comprising:

a semiconductor structure having a lower surface and a upper surface, and including a first semiconductor layer, an active layer, and a second semiconductor layer that are sequentially stacked in a laminating direction from said lower surface to said upper surface;

a transparent conducting layer located on said second semiconductor layer;

a first electrode located on said first semiconductor layer;

a second electrode located on said transparent conducting layer;

wherein when viewing said semiconductor structure and said transparent conducting layer from above said LED, said semiconductor structure has at least one side and at least one vertex corner portion connected to said side, said transparent conducting layer has at least one side and at least one bevel corner portion connected to said side, said side and said at least one bevel corner portion of said transparent conducting layer respectively corresponding to said side and said at least one vertex corner portion of said semiconductor structure; and wherein a distance (L1) between a middle point of said at least one bevel corner portion and a middle point of said at least one vertex corner portion ranges from 2 to 150 μm.

14. The LED (1) as claimed in claim 13, wherein:

when viewing said semiconductor structure from above said LED, said semiconductor structure has four of said sides that include a first short side, a first long side, a second short side, and a second long side defining a periphery of said semiconductor structure, and four of said vertex corner portions that include a first corner portion disposed between said first short side and said first long side, a second corner portion disposed between said first long side and said second short side, a third corner portion disposed between said second short side and said second long side, and a fourth corner portion disposed between said second long side and said first short side;

when viewing said transparent conducting layer from above said LED, said transparent conducting layer has four of said sides that includes a first side, a second side, a third side, and a fourth side; and four of said bevel corner portions that include a first curved corner disposed between said first side and said second side, a second curved corner disposed between said second side and said third side, a third curved corner disposed between said third side and said fourth side, and a fourth curved corner disposed between said fourth side and said first side;

said first side, said second side, said third side, said fourth side, said first curved corner, said second curved corner, said third curved corner, and said fourth curved corner respectively correspond to said first short side, said first long side, said second short side, said second long side, said first corner portion, said second corner portion, said third corner portion, and said fourth corner portion;

each of said first curved corner, said second curved corner, said third curved corner, and said fourth curved corner of said bevel corner portions has a radius of curvature that is greater than a radius of curvature of said corresponding one of said vertex edge portions; and a maximum distance (L2) between said fourth side of said transparent conducting layer and said second long side ranges from 2 to 30 μm.

15. The LED as claimed in claim 14, wherein:

each of said first curved corner, said second curved corner, said third curved corner and said fourth curved corner of said bevel corner portions has a radius of curvature that ranges from 30 to 200 μm; and each of said first corner portion, said second corner portion, said third corner portion, and said fourth corner portion of said vertex corner portions has a radius of curvature that ranges from 5 to 15 μm.

16. The LED as claimed in claim 14, wherein:

when viewing said semiconductor structure from above said LED, said second electrode includes a first main portion, and an first extension portion that is connected to said first main portion and that extends from said from said first main portion toward said first electrode, and that includes a first straight section, a curved section, and a second straight section; and said curved section having a radius of curvature (R2) that is less than said radius of curvatures (R1) of said bevel corner portions.

17. The LED as claimed in claim 6, wherein when viewing said semiconductor structure from above said LED, R1=R2+a; where a has a value that ranges from 90% to 110% of b, and b is a distance (L3) between said second straight section to said fourth side.

18. A light-emitting diode (LED) comprising:

a semiconductor structure having a lower surface and an upper surface, and including a first semiconductor layer, an active layer, and a second semiconductor layer that are sequentially stacked in a laminating direction from said lower surface to said upper surface;

a transparent conducting layer located on said second semiconductor layer;

a first electrode located on said first semiconductor layer;

a second electrode located on said transparent conducting layer;

wherein when viewing said semiconductor structure and said transparent conducting layer from above said LED, said semiconductor structure has two adjacent sides and one vertex corner portion that is connected between said two adjacent sides of said semiconductor structure, said transparent conducting layer has two adjacent sides and one bevel corner portion that is connected between said two sides of said transparent conducting layer, said two adjacent sides of said transparent conducting layer respectively correspond and are parallel to said two adjacent sides of said semiconductor structure, a radius of curvature (R1) of said bevel corner portion being greater than a radius of curvature of said vertex corner portion.

19. The LED as claimed in claim 18, wherein:

said radius of curvature (R1) of said bevel corner portion ranges from 30 to 200 μm; and said radius of curvature of said vertex corner portion ranges from 5 to 15 μm.

20. A light-emitting device comprising the LED as claimed in claim 1.

* * * * *